United States Patent [19]

Hashinaga et al.

[11] Patent Number: 5,359,285

[45] Date of Patent: Oct. 25, 1994

[54] METHOD AND APPARATUS FOR VARYING TEMPERATURE AND ELECTRONIC LOAD CONDITIONS OF A SEMICONDUCTOR DEVICE IN A BURN-IN TEST CHAMBER WHILE PERFORMING A BURN-IN TEST

[75] Inventors: Tatsuya Hashinaga; Masanori Nishiguchi, both of Yokohama, Japan

[73] Assignee: Sumitomo Electric Industries, Ltd., Osaka, Japan

[21] Appl. No.: 914,556

[22] Filed: Jul. 17, 1992

[30] Foreign Application Priority Data

| Jul. 19, 1991 | [JP] | Japan | 3-179774 |
| Jul. 29, 1991 | [JP] | Japan | 3-189019 |
| Jul. 30, 1991 | [JP] | Japan | 3-190024 |
| Jul. 31, 1991 | [JP] | Japan | 3-192295 |
| Jul. 31, 1991 | [JP] | Japan | 3-192296 |
| Jul. 31, 1991 | [JP] | Japan | 3-192303 |
| Jul. 31, 1991 | [JP] | Japan | 3-192306 |
| Jul. 31, 1991 | [JP] | Japan | 3-192311 |

[51] Int. Cl.$^5$ ............... G01R 15/12; F25B 29/00
[52] U.S. Cl. ............... 324/158.1; 165/80.3
[58] Field of Search ............... 324/158 R, 73.1, 158 F; 361/385, 412, 415; 165/80.4, 80.3; 437/8; 219/209, 210

[56] References Cited

U.S. PATENT DOCUMENTS

| 3,092,998 | 6/1963 | Barton | 324/158 T |
| 4,145,620 | 3/1979 | Dice | 361/415 |
| 4,636,725 | 1/1987 | Santomango et al. | 324/158 F |
| 4,734,641 | 3/1988 | Byrd, Jr. et al. | 324/158 F |
| 4,745,354 | 5/1988 | Fraser | 324/158 F |
| 4,881,591 | 11/1989 | Rignall | 324/158 F |
| 4,902,969 | 2/1990 | Gussman | 324/158 R |
| 5,001,423 | 3/1991 | Abrami et al. | 324/158 F |
| 5,047,711 | 9/1991 | Smith et al. | 324/158 P |

FOREIGN PATENT DOCUMENTS

| 0283778 | 9/1988 | European Pat. Off. |
| 57-31147 | 2/1982 | Japan . |
| 8701813 | 3/1987 | PCT Int'l Appl. |

OTHER PUBLICATIONS

Patent Abstracts of Japan, vol. 15, No. 88, Dec. 18, 1990.
Patent Abstracts of Japan, vol. 10, No. 341, Jul. 2, 1986.
D. C. Banker, M. A. Battista, S. C. Chen, Sense Diode, IBM Technical Disclosure Bulletin, Mar. 1981, vol. 23 No. 10, pp. 4497–4498.
C. Delettrez, H. J. N. Spruyt, Thermal Characterization of Power MOS-FETS. Results Obtained With the IR-F-250., European Space Agency SP-294, Aug. 1989, vol. 1, pp. 71–77.
Patent Abstracts of Japan, vol. 6, No. 99, Feb. 19, 1992.
Anonymous, "Method to Determine Substrate Potential and Chip Temperature", Research Disclosure, No. 311, Mar. 1990, p. 191.
C. C. Yu, "Self-Heating Test Chip for Reliability Life Test", IBM Technical Disclosure Bulletin, vol. 25, No. 7B, Dec. 1982, p. 3651.
G. Siva Bushanam et al.,"Measuring Thermal Rises due to Digital Device Overdriving" (The Three Faces of Test: Design, Characterization, Production), International Test Conference 1984 Proceedings, Oct. 1984, pp. 400–423.

*Primary Examiner*—Vinh Nguyen
*Attorney, Agent, or Firm*—Cushman, Darby & Cushman

[57] ABSTRACT

A burn-in apparatus for use in burn-in tests includes a burn-in test container for accommodating a plurality of semiconductor device. Also, the burn-in apparatus includes a measuring device for individually measuring junction temperatures of semiconductor chips of the respective semiconductor device by detecting electric characteristics of temperature sensors built in the semiconductor chips, and a temperature adjusting device for controlling amounts of heat radiation and conduction of the semiconductor chips. The temperature adjusting device, such as device for controlling air flow rates of air nozzles of the container, is controlled by control device on the basis of outputs of the measuring device. Thus, the junction temperatures can be kept within a predetermined temperature range to thereby improve the accuracy of screening tests.

27 Claims, 25 Drawing Sheets

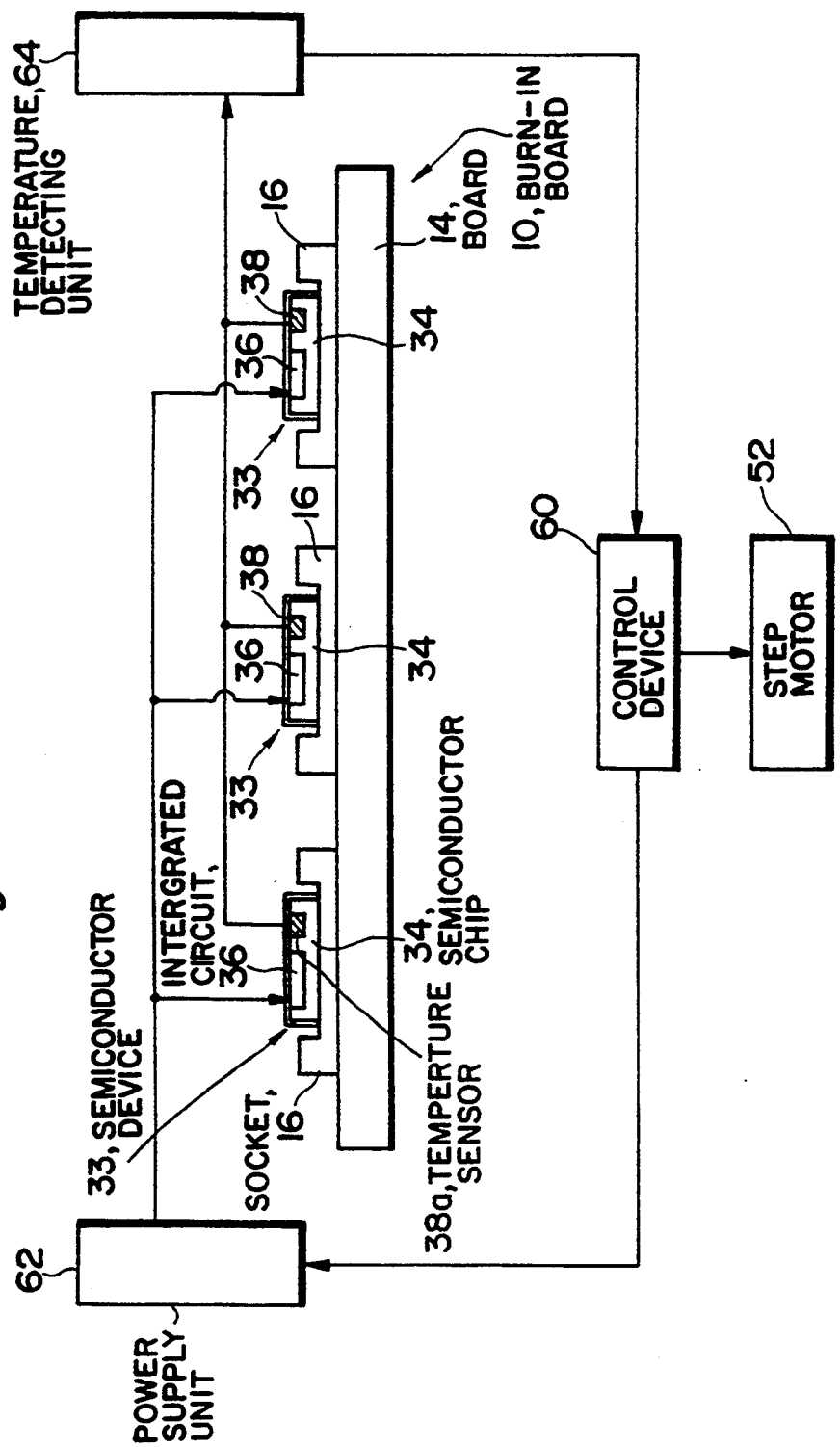

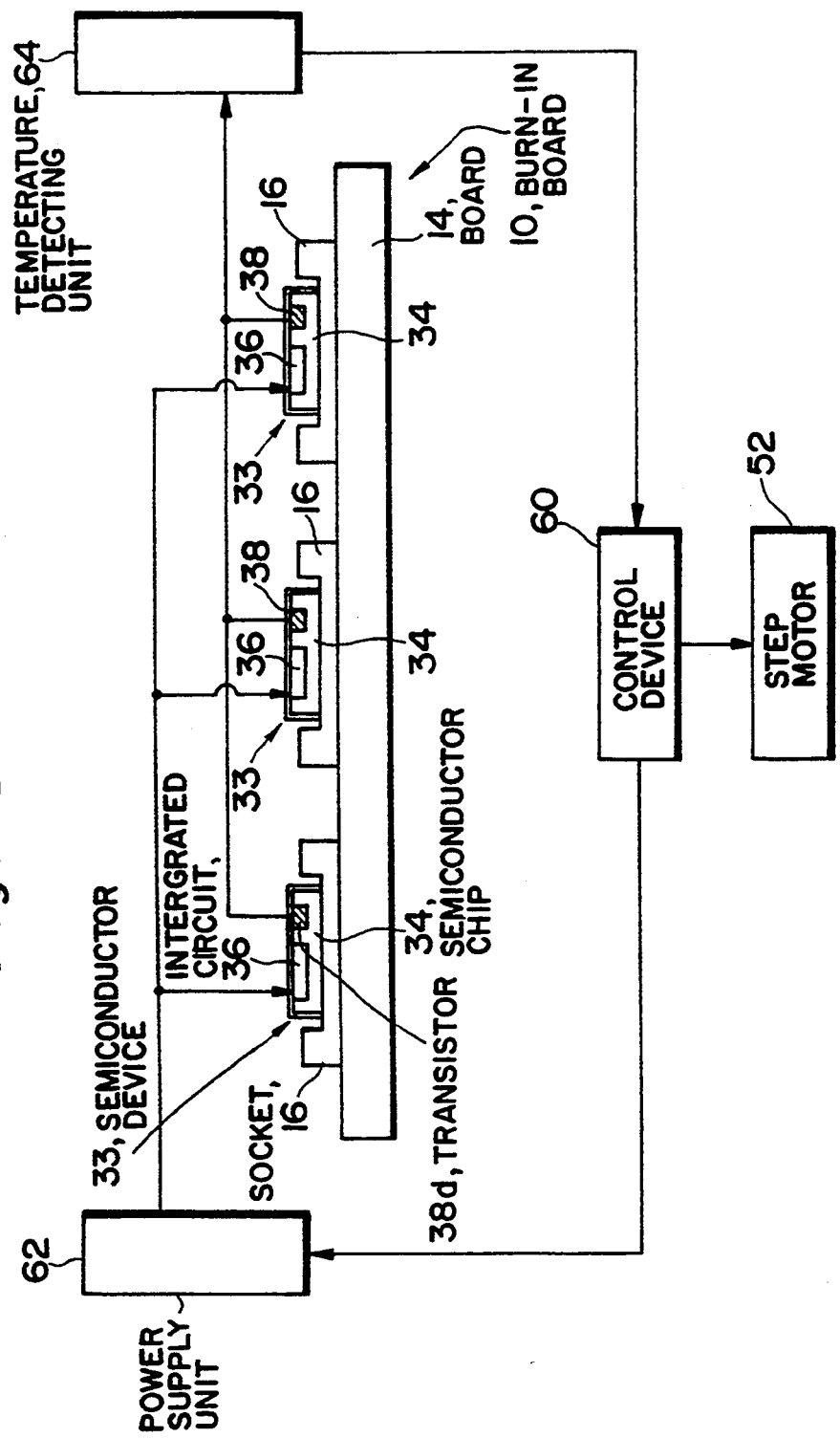

METHOD AND APPARATUS FOR VARYING TEMPERATURE AND ELECTRONIC LOAD CONDITIONS OF A SEMICONDUCTOR DEVICE IN A BURN-IN TEST CHAMBER WHILE PERFORMING A BURN-IN TEST

BACKGROUND OF THE INVENTION

1. Field of the Invention

This invention relates to a burn-in apparatus and method which is used in burn-in tests (high temperature operating test) in which temperature loads and electric loads are applied to semiconductor devices to be tested.

2. Related Background Art

Burn-in tests are essential to the life estimation of semiconductor devices, and to the detection of infant mortality or early lifetime failures in screening processes. Generally, a burn-in test is conducted using burn-in boards 10 of FIG. 1 and a burn-in test chamber 12 of FIG. 2. Each burn-in board 10 includes a board 14 of a heat resistant resin or the like. This board 14 has a plurality of sockets 18 provided thereon for receiving DUTs (devices under test) or semiconductor devices (not shown), and external terminals 18 provided on one end of the board 10 for the electrical contact to the outside. The board 14 has a handle 20 provided on the opposite end for the manipulation of the burn-in board by an operator. The terminals (not shown) of the sockets 16 are connected to the external terminals 18 by wirings 22 (partially shown in FIG. 1) on the board 14.

Such burn-in boards 10 are set in the burn-in test chamber 12 as shown in FIG. 2, More specifically, the burn-in test chamber 12 comprises a box body 24 as a main body, a lid 26 attached to the box 24 by a hinge mechanism 28, and a board connector 30 provided in the box body 24. The board connector 30 has slits 32 for receiving the boards 14 of the burn-in board 10. When the boards 14 are inserted into the slits 32 of the board connector 30, the external terminals 18 of the burn-in boards 10 and the terminals (not shown) of the board connector 30 are connected. Through this connection, an electric power is supplied to the semiconductor devices by a power supply means (not shown). Although not shown, the burn-in test chamber 12 includes a temperature adjusting means. The temperature adjusting means is generally in the form of a means for supplying heated air into the interior of the burn-in test chamber 12, or in the form of a heating means.

An interior temperature of the burn-in test chamber 12, i.e., an environmental temperature $T_a$ of the atmosphere surrounding the semiconductor devices is measured by a temperature sensor (not shown) disposed near the inner surface of the wall of the box 24. The conventional burn-in test have been conducted by controlling the temperature adjusting means while monitoring measured temperatures (MIL-STD 883). But for the following reasons, such conventional art is insufficient to properly conduct the burn-in tests.

In the conventional art, what can be monitored real time is an environmental temperature $T_a$ of temperature $T_a$ does not agree with a surface temperature semiconductor devices, and this environmental of the semiconductor chips constituting the semiconductor devices, especially with junction temperatures $T_j$ at the pn junctions or Schottky junctions of the semiconductor chips. Since failures of semiconductor devices depend on these junction temperatures $T_j$, in the conventional burn-in tests, a junction temperature $T_j$ is estimated based on a measured environmental temperature $T_a$, and burn-in tests is conducted based on the estimated junction temperature. Very complicated operations are measuring to check relationships between an environmental temperature $T_a$ and a junction temperature $T_j$, and different estimating operations are needed in accordance with different sizes types and specifications of semiconductor devices to be tested. Accordingly it has been difficult to conduct simple burn-in tests with high precision. Additionally, the environmental temperature $T_a$ varies depending on locations in the burn-in test chamber 12, and heat generation amounts of respective semiconductor devices to be tested are not the same either. Therefore, it has not been easy to screen a number of semiconductor devices under uniform conditions.

SUMMARY OF THE INVENTION

It is an object of this invention to provide a burn-in apparatus and method which can control, with high precision, surface temperatures or junction temperatures of the semiconductor chips themselves in the semiconductor devices which are burn-in tested at the same time.

To achieved this object, this invention is directed to a burn-in apparatus which comprises: a burn-in test chamber having a plurality of air nozzles; at least one burn-in board disposed the test chamber for mounting a plurality of semiconductor devices each of which incorporates at least one semiconductor chip; measuring means for detecting electric characteristics of temperature sensors built in the respective semiconductor chips to individually measure junction temperatures of the semiconductor chips; temperature adjusting means for controlling amounts of heat radiation and conduction of the semiconductor chips to adjust the junction temperatures of the semiconductor chips; and control means for controlling, based on outputs of the measuring means, the means so that the junction temperatures of the semiconductor chips are within a predetermined temperature range.

Preferably, the temperature adjusting means includes means for adjusting air flow rate from the air nozzle, means for controlling the opening and closing of the air nozzle, means for changing air flow direction of the air nozzle, means for moving an air outlet of the air nozzle to and away from the semiconductor devices, or means for adjusting temperature of air flow from the air nozzle. Also, in the case that burn-in board is rotatably provided in the burn-in test chamber, the temperature adjusting means may include means for rotating the burn-in board to change its orientation to the air flow direction of the air nozzles.

Also, this invention relates to a burn-in method which comprises: the step of positioning at least one burn-in board with a plurality of semiconductor devices in a burn-in test chamber with a plurality of air nozzles, each of the semiconductor devices incorporating at least one semiconductor chip with temperature sensor built in; the step of detecting electric characteristics of the temperature sensors to individually measure junction temperatures of the semiconductor chips; and the step of controlling amounts of heat radiation and conduction of the semiconductor chips so that measured results of the junction temperatures of the semiconductor chips are in a predetermined range.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

In the course of the following detailed description, reference will be made to the attached drawings in which:

FIG. 4A is a diagrammatic view of a temperature detecting and controlling system of the burn-in apparatus according to this invention;

FIG. 4D is a further modification of the view of FIG. 4A wherein the temperature sensor is a transistor;

FIG. 18 is a diagrammatic view of an air flow system of the burn-in apparatus according to a fifth embodiment of this invention;

DETAILED DESCRIPTION OF THE PREFERRED EMBODIMENT

Figure 1:
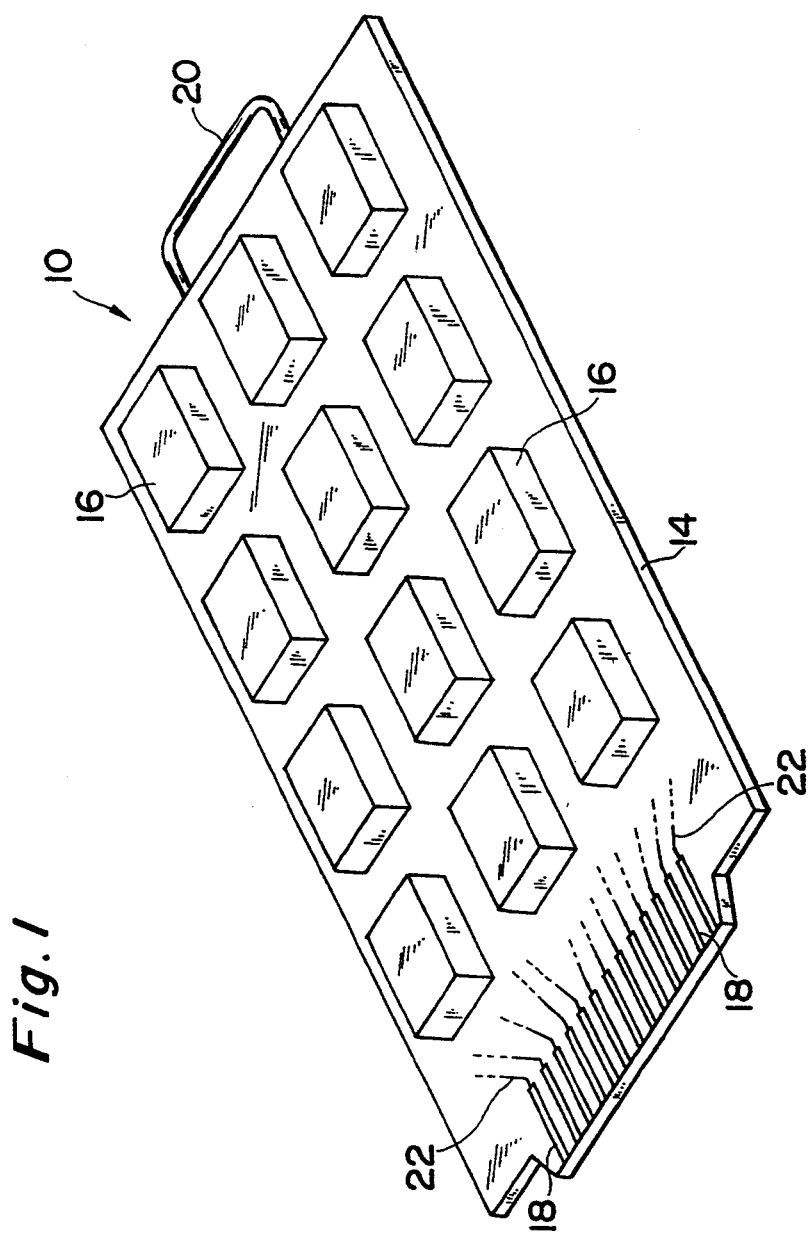
FIG. 1 is a perspective view of a typical burn-in board used in burn-in tests.

In the following description, like reference numerals designate like or corresponding parts throughout the several views.

Figure 2:
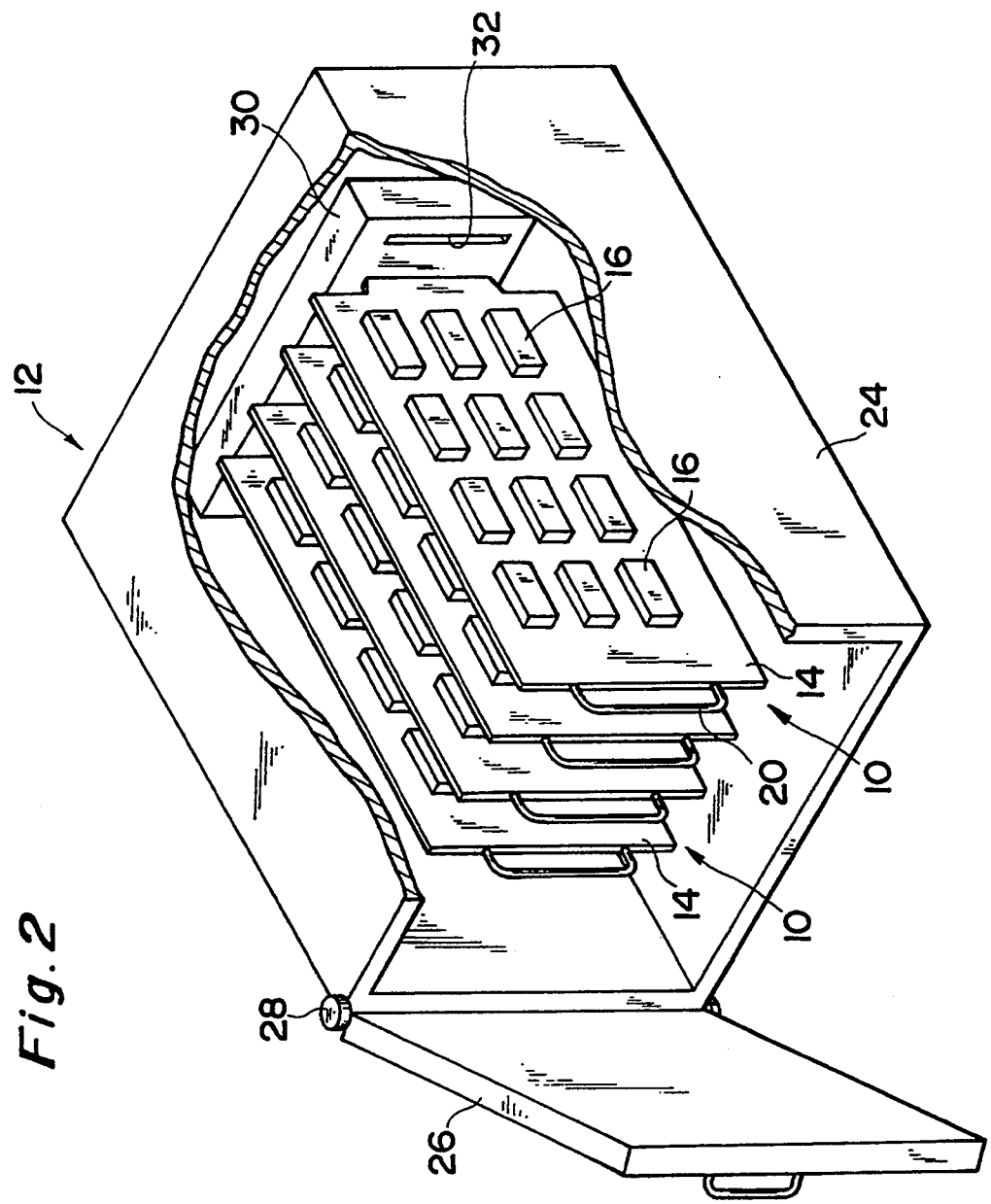
FIG. 2 is a partially broken perspective view of a burn-in test chamber with a plurality of burn-in boards disposed therein.
Figure 3:
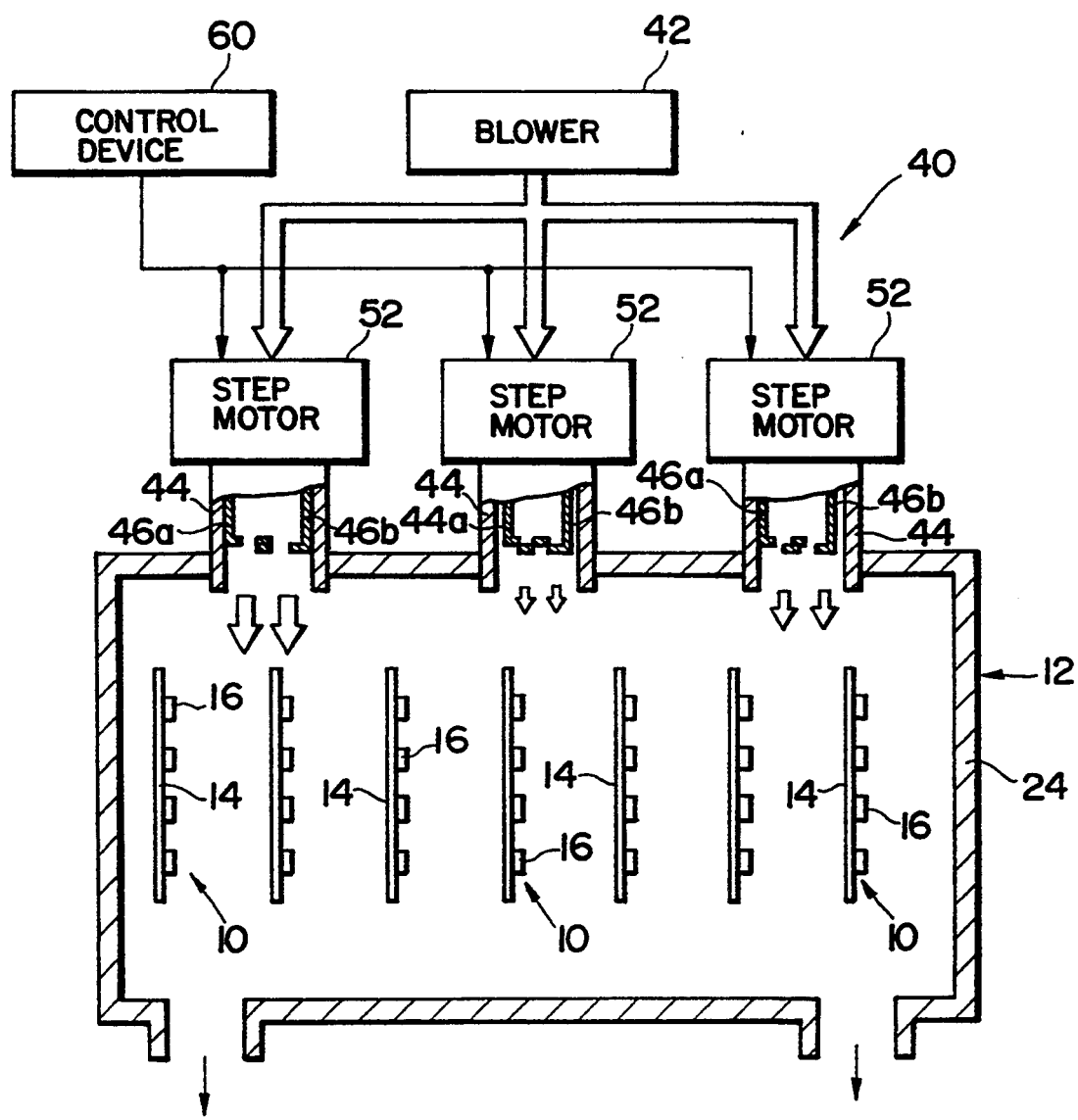
FIG. 3 is a diagrammatic view of an air flow system of the burn-in apparatus according to a first embodiment of this invention.
Figure 4B:
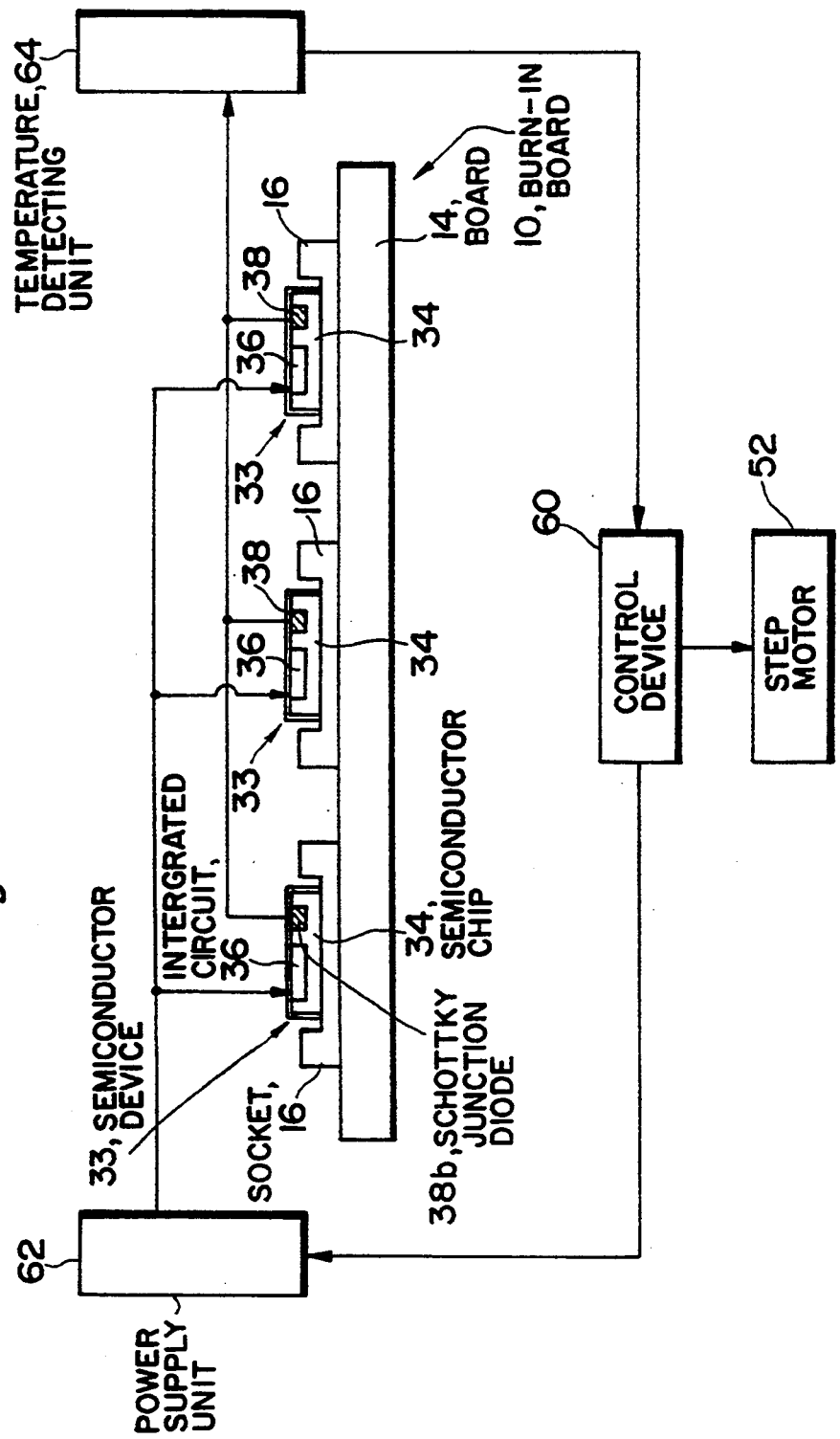
FIG. 4B is a modification of the view of FIG. 4A wherein the temperature sensor is a Schottky diode.
Figure 4C:
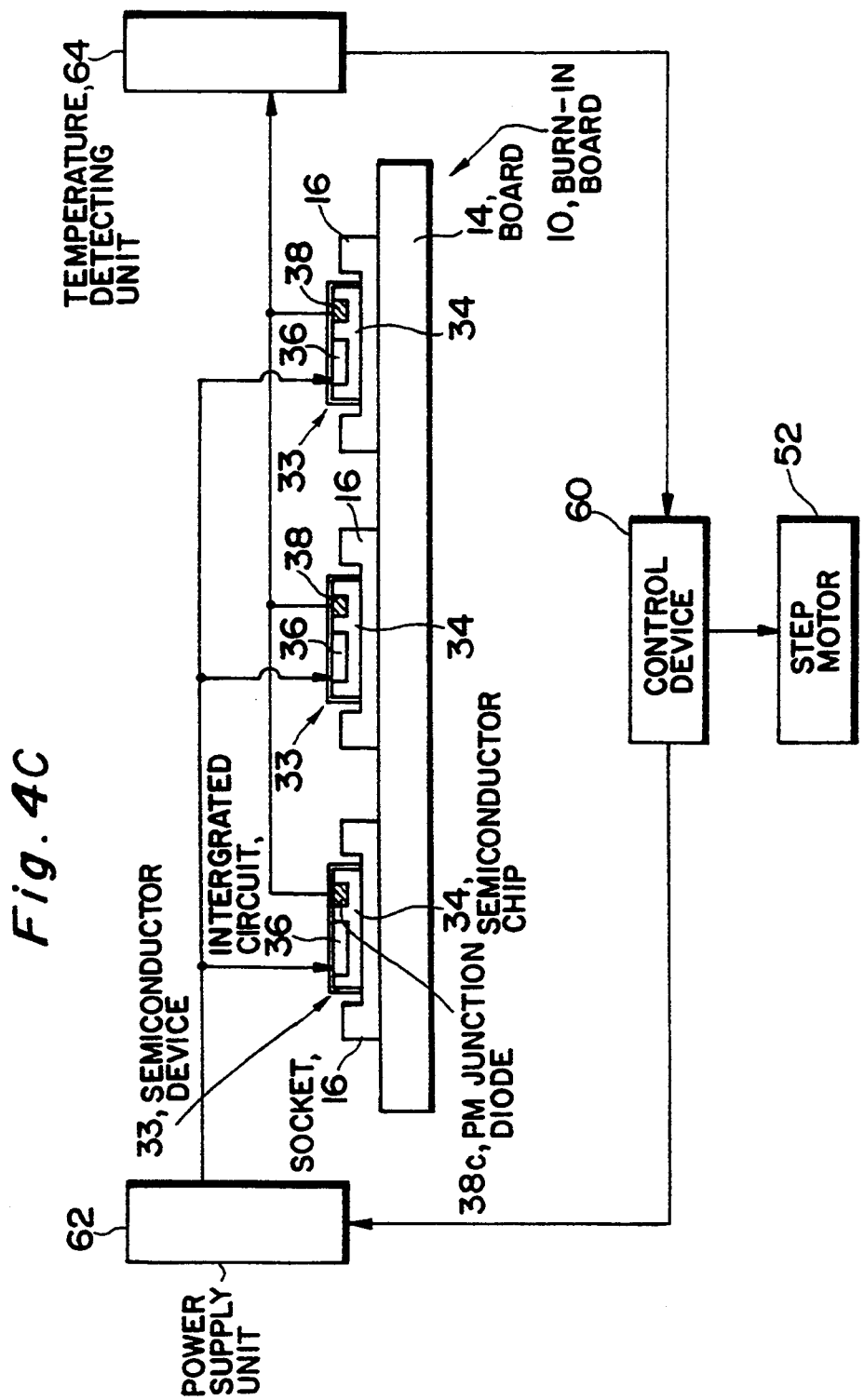
FIG. 4C is a further modification of the view of FIG. 4A wherein the temperature sensor is a pn junction diode.
Figure 4E:
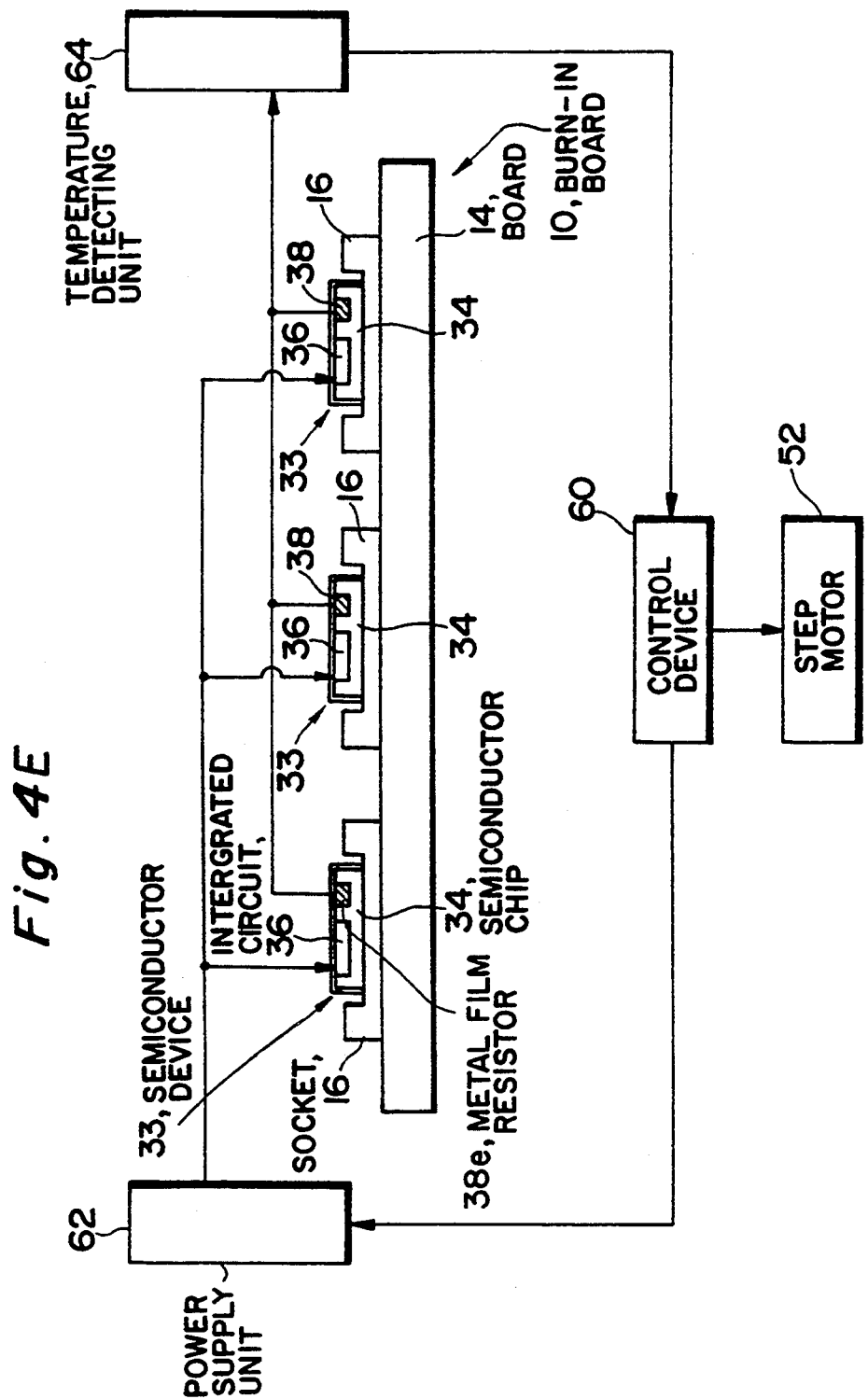
FIG. 4E is a further modification of the view of FIG. 4A wherein the temperature sensor is a metal film resistor.

FIG. 3 is a diagrammatic view of an air flow system of a burn-in apparatus according to a first embodiment of this invention. FIG. 4A shows diagrammatically a temperature detecting system and a power supply system of this first embodiment. The burn-in apparatus according to the first embodiment comprises the same burn-in test chamber 12 including a box body 24 and a lid (see FIG. 2) as the above-described conventional burn-in test chamber. In FIG. 4A, a plurality of burn-in boards 10 are set parallel with each other in the burn-in test chamber 12, and one semiconductor device 33 having a semiconductor chip 34 inside thereof is mounted in each of sockets 16 provided on the board 14 of each of the burn-in boards 10. On the semiconductor chip 34 there are provided an integrated circuit 36 and a temperature sensor 38a as a temperature detecting diode. As shown in FIG. 4B, it is desirable that the temperature sensor is a GaAs Schottky junction diode 38b. Alternatively, as shown in FIGS. 4C–4E, the temperature sensor 38 can be a PM junction diode 38c, transistor 38d or metal film resistor 38e, respectively.

The burn-in test chamber 12 is incorporated with a temperature adjusting means 40 for adjusting surface temperatures of junction temperatures $T_j$ of the semiconductor chips. According to the first embodiment, the temperature adjusting means 40 comprises one blower 42 with a heater built in, and air nozzles 44 extended through and fixed to the box body 24 of the burn-in test chamber 12 for discharging the heated air from the blower 42 into the box body 24. In the first embodiment of FIG. 4A, three air nozzles 44 are attached to the burn-in test chamber 12. Also, the temperature adjusting means 40 includes air flow rate adjusting means each of which is provided in the corresponding air nozzle 44.

Figure 5:
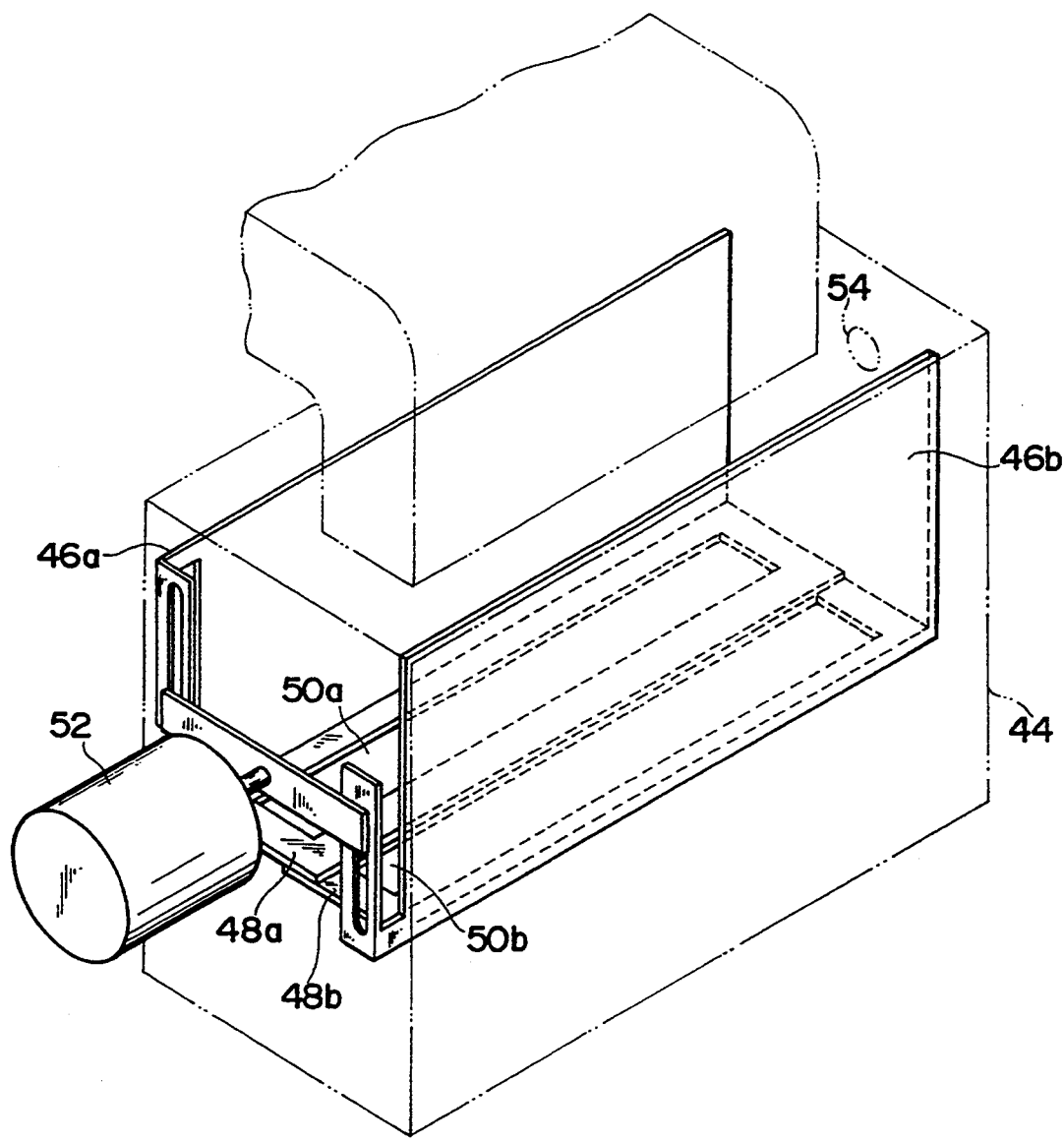
FIG. 5 is a perspective view of one example of the air flow rate adjusting means of the burn-in apparatus of FIG. 3.
Figure 6:
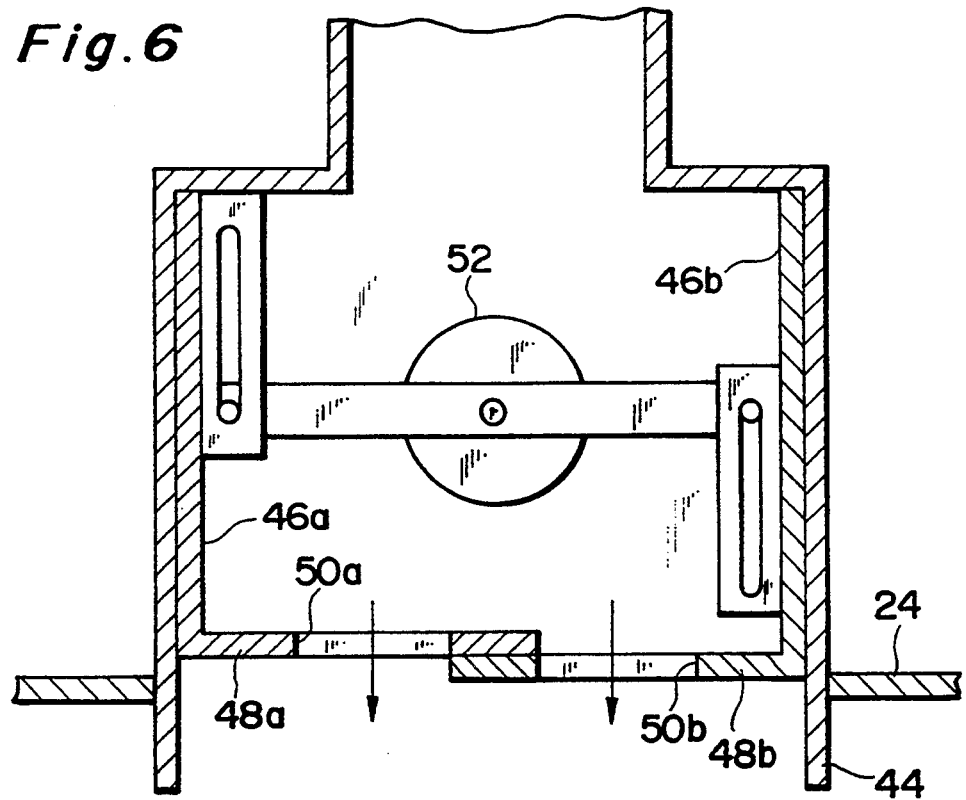
FIGS. 6 and 7 are sectional views explaining the operation of the air flow rate adjusting means of FIG. 5, FIG. 8 showing a state of a maximum air flow rate, and FIG. 7 showing a state of a minimum air flow rate.
Figure 7:
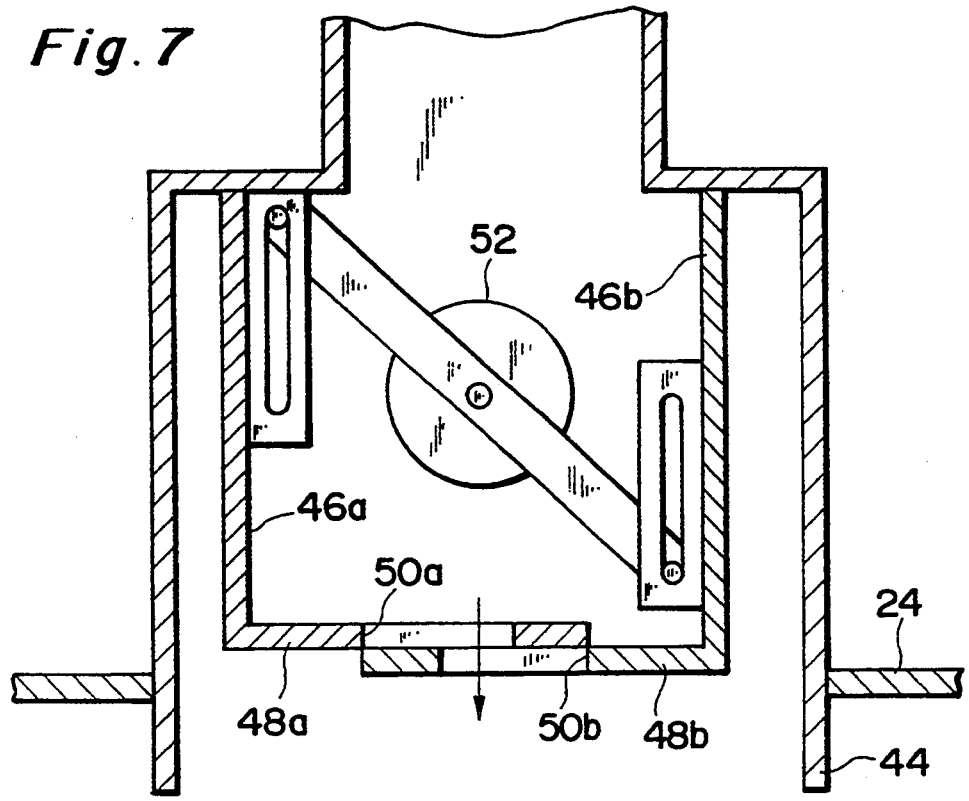

As the air flow rate adjusting means, various flow control devices can be used. In the first embodiment, the air flow rate adjusting means comprises, as shown in FIG. 5, two L-shaped adjusting plates 46a, 46b. Each adjusting plate 46a, 46b has an elongated opening 50a, 50b in the horizontal portion 48a, 48b. The adjusting plates 46a, 46b are arranged in the air nozzle 44 such that the horizontal portions 48a, 48b are superposed on each other. These adjusting plates 46a, 46b are horizontally reciprocated by a step motor 52. The step motor 52 is suitably controlled by a control device 60 which will be explained below. In the state of FIG. 6, the openings 50a, 50b of the adjusting plates 46a, 46b are not laid on each other, and the air flow from the air nozzle 44 has a maximum flow rate. In the state of FIG. 7, the opening 50a of one 46a of the adjusting plates 46a, 46b is partially overlapped with the solid section (the unopened section) of the horizontal portion 48b of the other 46a of the regulating plates 46a, 46b, and the air flow from the air nozzle 44 has a minimum flow rate. The overlap between the horizontal portions 48a, 48b of the adjusting plates 46a, 46b is thus varied by controlling the step motor 52, whereby the flow rate of the air from the nozzle 44 can be adjusted. In FIG. 5, the reference numeral 54 indicates a relief valve for preventing the extreme increase of a pressure in the nozzle 44 when the openings 50a, 50b are closed.

An electric load is individually applied to the integrated circuits 36 of the semiconductor chips 34 by a power supply unit 62, as explained below in more detail. Also, electric characteristics (especially changes of the rising voltage or forward voltage (threshold voltage) $V_F$) of the temperature detection diodes 38 are individually monitored by a temperature detecting unit 64 to measure junction temperature $T_j$ of the respective semiconductor chips 34.

The temperature detecting unit 64 is connected to the control device 60 to which the monitored results of the temperature detecting means 64 is input. The control device 60 outputs control signals to the power supply unit 62, based on the monitored results of the temperature detecting unit 64 so as to control power supply amounts to the integrated circuits 36 within an allowable range, and also controls the step motors 52 for driving the air flow rate adjusting means to control air flow rates of the air nozzles 44. The control device 80 stores an allowable range of the junction temperatures $T_j$ for a burn-in test, and is previously programmed to compare the allowable range with the monitored results of the temperature detecting unit 64 and properly control the air flow rate adjusting means.

By the way, in measuring electric characteristics of the temperature detection diode 38, a junction temperature of the temperature detection diode 38 is measured. The heat resistance of the semiconductor chip 34 is sufficiently smaller than heat resistances of its ambient substances (air, or molding materials), and the following relationships are given.

(A junction temperature of the temperature detection diode 38) $\approx$ (A junction temperature of the integrated circuit 36) = $T_j$ Hereinafter both junction temperatures are represented commonly by $T_j$.

Figure 8:
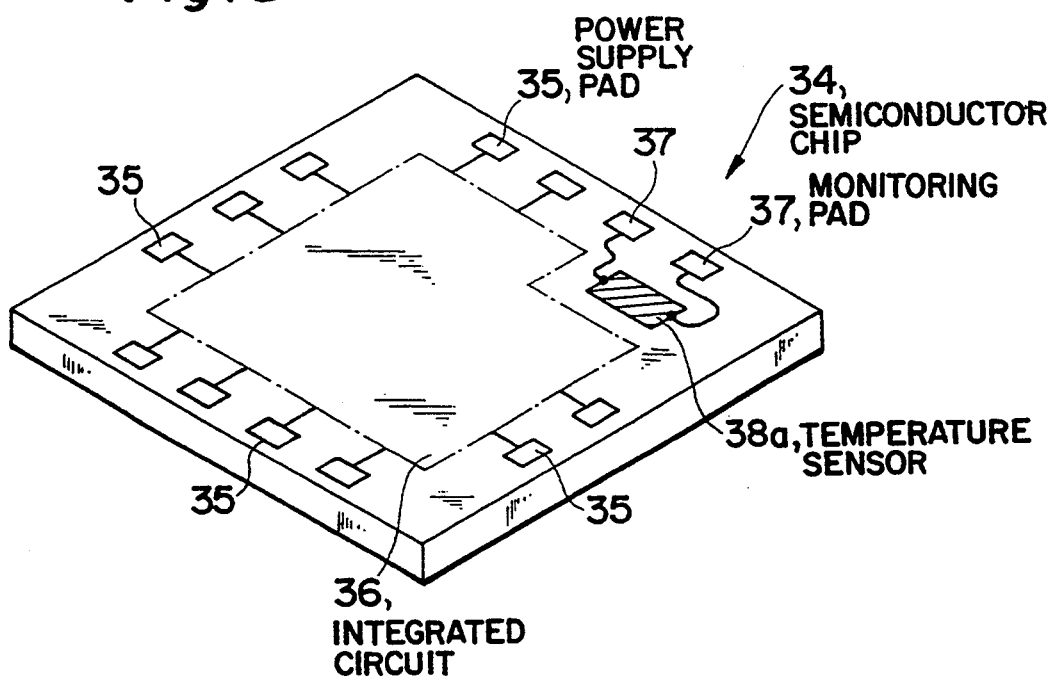
FIG. 8 is a perspective view of a semiconductor chip of a semiconductor device to be tested.
Figure 9:
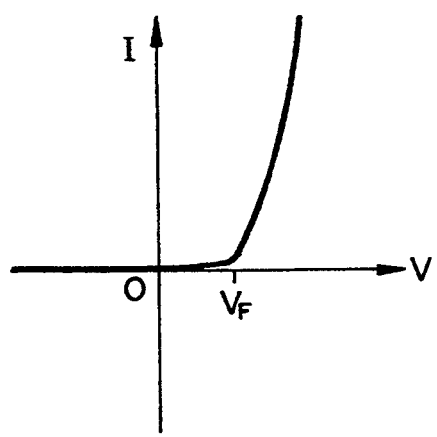
FIG. 9 is a graph of an I–V characteristic of a temperature detection diode in the semiconductor chip at a temperature.

FIG. 8 shows a perspective view of the semiconductor chip 34 involved in the above-described embodiment. FIG. 9 is a graph of an I-V characteristic of the temperature sensor 38a at a temperature. As shown in FIG. 8, on the semiconductor chip 34, there are formed the integrated circuit 36, the temperature sensor 38a a power supply pad 35 connected to the integrated circuit 36 and monitoring pads 37 connected to the anode and the cathode of the temperature sensor 38a which is a temperature detection diode. This semiconductor chip 34 is packaged in a flat package or a leadless chip-carrier (LCC) as a semiconductor device 33 to be burn-in tested. The temperature monitoring for this semiconductor chip 34 is based on the observation of an I-V characteristic of the temperature sensor 38a. That is, the forward voltage $V_F$ of the I-V characteristic of FIG. 9 changes substantially linearly with respect to junction temperatures in a range of junction temperatures exhibited in a burn-in test of the semiconductor device. This relationship is approximately expressed by the following Formula 1.

$$V_F \approx TC \cdot T_j + V_{F0} \tag{1}$$

$V_F$: Forward voltage of a temperature detection diode
TC: Temperature coefficient of $V_F$ value
$T_j$: Junction temperature of a semiconductor device or chip to be tested
$V_{F0}$: Constant given for each semiconductor device or chip to be tested A current flowing through the temperature detection diode 38 when a forward voltage $V_F$ is applied thereto is so trivial that the temperature detection diode does not contribute much to increases of a junction temperature. When the forward voltage $V_F$ is measured with the integrated circuit 36 unfed, a junction temperature $T_j$ agrees with an environmental temperature.

Figure 21:
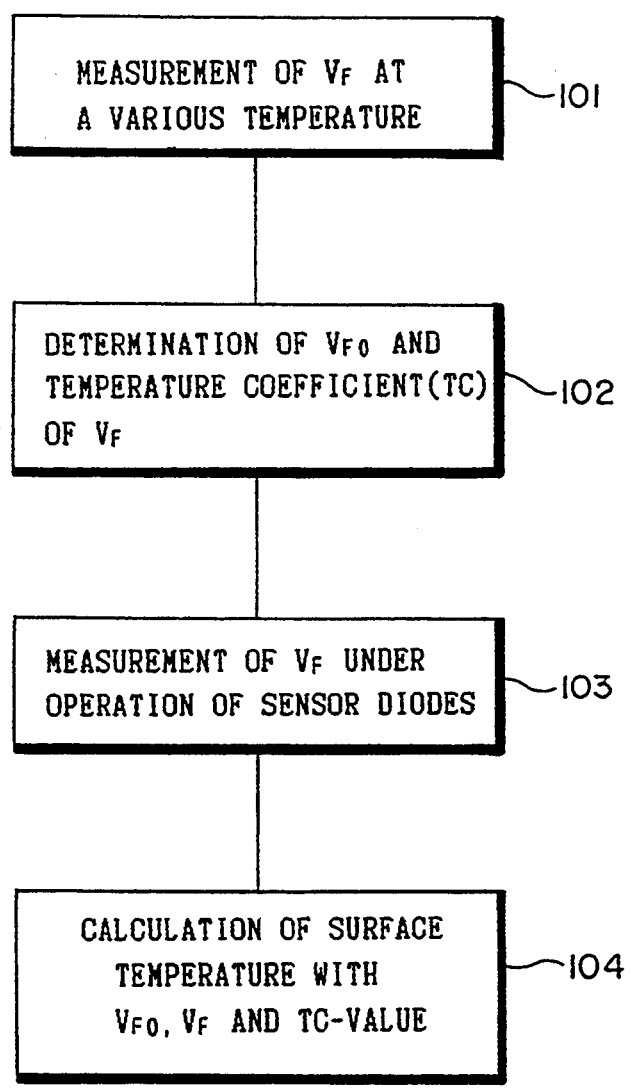
FIG. 21 is a flow chart of a first measuring method of junction temperature.

A first temperature measurement technique uses the above-described property, and the flow chart of this technique is shown in FIG. 21. First, values of a forward voltage $V_F$ are measured at different environmental temperatures with the integrated circuit 36 unfed (Step 101). Based on the measured values of the forward voltage and Formula 1, a value of a constant $V_{F0}$ of the forward voltages $V_F$, and a value of a temperature coefficient TC of the forward voltages $V_F$ are given (Step 102). Following this preparation, a burn-in test is started, and during the burn-in test, temperatures of the semiconductor chips 34 are accurately detected. That is, semiconductor chips 34 are mounted on the burn-in apparatus, and while the integrated circuits 36 are in operation with a current supplied to, values of the forward voltages $V_F$ are measured (Step 103). Values of the junction temperatures $T_j$ are given based on the value of the constant $V_{F0}$, the value of the temperature coefficient TC, and measured values of forward voltages $V_F$ (Step 104).

Also, the following second junction temperature measurement technique can give measured values of precision as high as the first technique.

Figure 22:
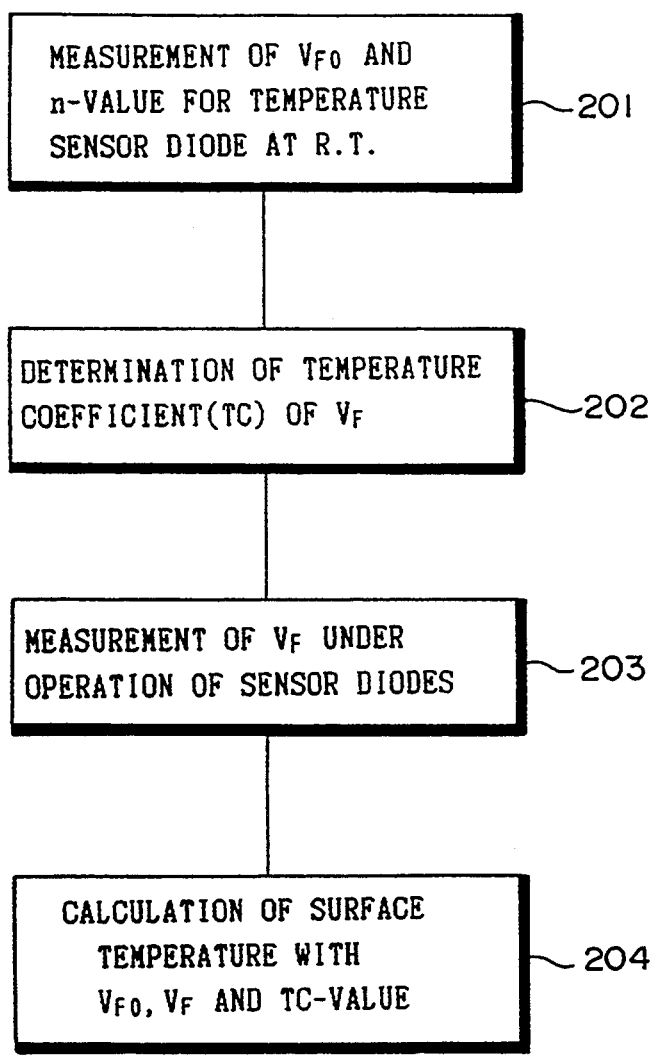
FIG. 22 is a flow chart of a second measuring method of junction temperature.

FIG. 22 shows the flow chart of the second junction temperature measurement technique. First, a value of a constant $V_{F0}$ of a temperature detection diode formed on the semiconductor chip 34, and an ideal value n thereof are given at the room temperature (Step Here, a forward current $I_F$ of the Schottky type temperature detection diode 38b is given by the following Formula 2.

$$I_F \approx SA^*T^2 \exp\left(-\frac{q\phi_B}{kT}\right)\exp\left(\frac{qV_F}{nkT}\right) \tag{2}$$

S: Schottky junction area
A*: Effective Richardson constant
T: Absolute temperature
k: Boltzmann constant
q: Electron charge $\phi_B$: Barrier height
n: Ideal factor A forward threshold voltage $V_F$ of the Schottky temperature detection diode 38b and an ideal factor n thereof can be given based on an I-V characteristic of the Schottky temperature detection diode 38b. A temperature coefficient TC of the temperature detection diode 38 is given by the following Formula 3.

$$TC = \frac{\partial V_F}{\partial T} = \frac{nk}{q}\left(2 - \ln\frac{I_F}{SA^*T^2}\right) \quad (3)$$

Figure 23:
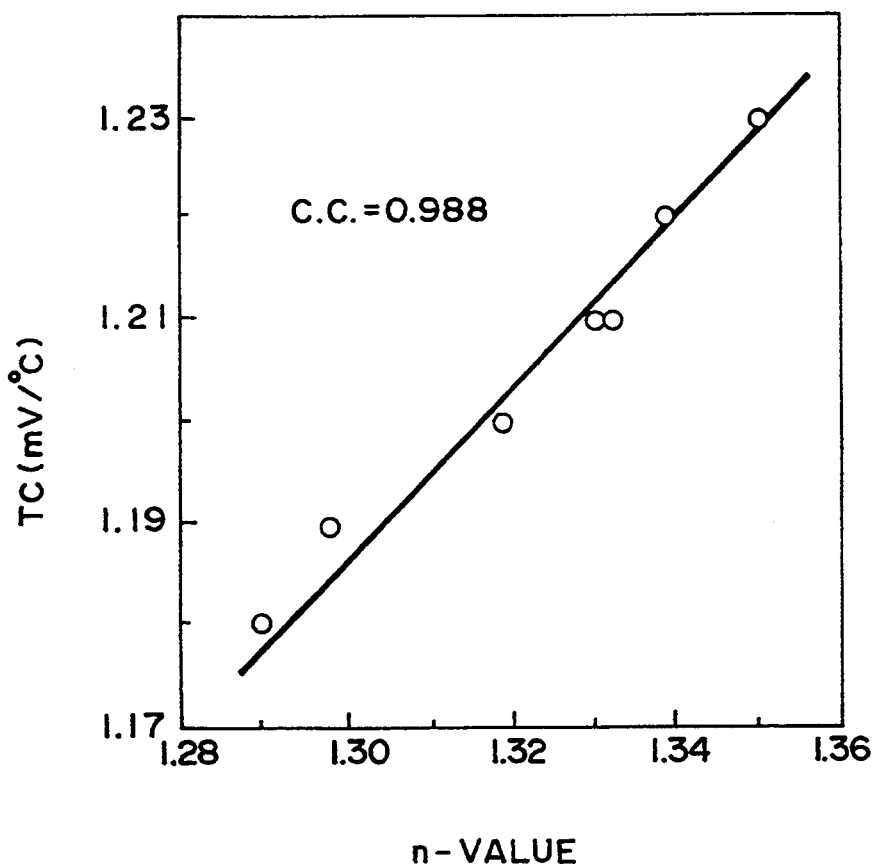
FIG. 23 is a graph of an experimental result of a relationship between TC value and n value.

Variations of a value of the second term in the parentheses of Formula 3 are sufficiently small in the junction temperature range of burn-in tests, so that the TC value is almostly proportional to the n value. This relation between TC value and n value was confirmed by an experimental result shown in FIG. 23.

A temperature coefficient TC of the forward voltage $V_F$ is given by Formula 1 and 2 (Step 202) to detect an accurate temperature of the semiconductor chip 34 during a burn-in. That is, semiconductor chips 34 are mounted on the burn-in apparatus, and while the integrated circuits 36 are in operation with a current supplied to, values of the forward threshold voltages $V_F$ are measured (Step 203). Then, based on the value of the constant $V_{F0}$ given at the room temperature, the values of the threshold voltages $V_F$ given real time during a burn-in, and a value of the ideal factor n, junction temperatures $T_j$ of the temperature detection diodes (temperature sensor 38a), i.e, surface temperatures of the semiconductor chips 34, are given real time (Step 204). Thus, junction temperatures $T_j$ can be correctly given based on changes of the forward voltage $V_F$.

Figure 10:
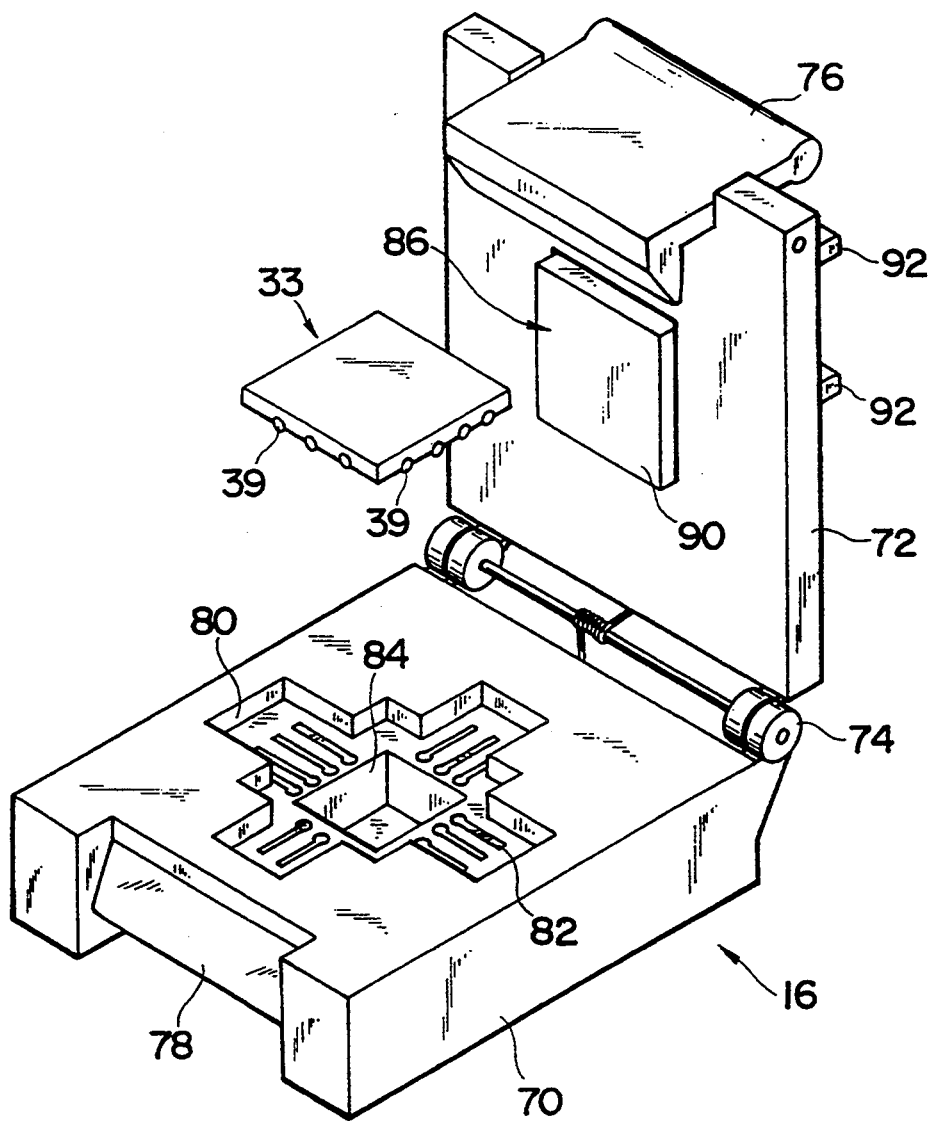
FIG. 10 is a perspective view explaining the way of mounting the semiconductor to be tested on a socket provided on the burn-in board.
Figure 11:
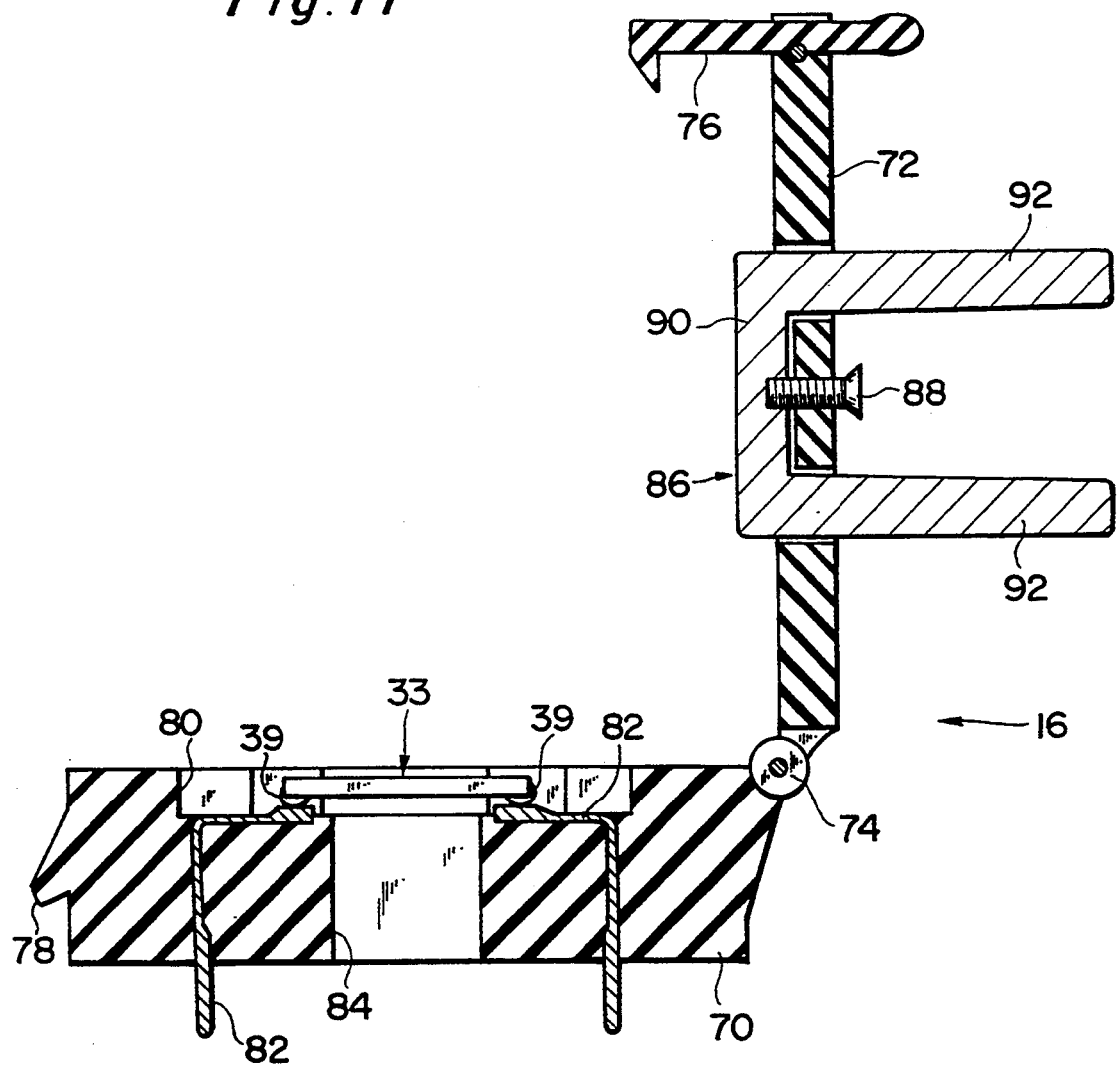
FIG. 11 is a sectional view of the socket and the semiconductor device mounted on the socket.

FIGS. 10 and 11 show the way of mounting the semiconductor device 33 in a socket 16 in the burn-in apparatus according to the above-described first embodiment. Each socket 16 provided on a burn-in board 10 comprises a base 70 and a lid 72 connected to the base 70 openably by a hinge 74. When a lever 76 attached to the lid 72 is locked with a hook 78 formed on the base 70, the base 70 is closed by the lid 72. In the central portion of the base 70 there is formed a cross-shaped concavity 80. A plurality of terminals 82 are provided on the bottoms of the arm portions of the concavity 80. One ends of the respective terminals 82 are projected from the underside of the base 70 to be connected to the wirings on the board 14 of the burn-in board 10. A through-hole 84 is formed in the central portion of the cross-shaped concavity 80.

A radiating and conducting member 86 is secured by screws 88 to the central portion of the lid 72. This member 86 comprises a flat panel 90 on the side of the lid 72 to be opposed to the base, and radiation panels 92 formed integrally with the flat panel 90 and extended through the lid 72.

The semiconductor device 33 has a plurality of terminals 39 provided on the underside thereof. These terminals 39 are brought into contact with the corresponding terminals 82 of the socket 16 when the semiconductor device 33 is mounted in the socket 16. When the lid 72 is closed with the semiconductor device 33 received in the concavity 80, the flat panel 90 of the radiating and conducting member 86 is brought into contact with the top surface of the semiconductor device 33 so that the heat of the semiconductor device 33 or semiconductor chip 34 can be conducted and radiated. Therefore, the flow rate of the air applied to the panels 92 of the radiating and conducting member 86 is changed to thereby control the heat radiation and conduction amount of the semiconductor device 33 and adjust a temperature of the same.

The junction temperature of the semiconductor chip 34 depends not only on an environmental temperature $T_a$ which varies depending on locations in the burn-in test chamber 12, but also on a heat generation amount of the integrated circuit 36 and an amount of the radiation and conduction of the integrated circuit 36 to the outside, and the heat generation amount and the radiation and conduction amount greatly vary depending on mounting conditions and so on of the semiconductor device 34. However, in this embodiment, temperatures of the temperature sensors 38a provided on the individual semiconductor chips 34 are individually monitored, and junction temperatures $T_j$ of all the semiconductor chips 34 can be directly measured. Consequently, junction temperatures of the semiconductor chips 34 themselves can be monitored with high precision on each of a plurality of semiconductor devices 34.

Based on these monitored results, air flow rates of the air nozzles 44 can be individually controlled to very precisely regulate the surface temperatures or junction temperatures $T_j$ of all the semiconductor chips 34 to be relatively uniform. That is, the air flow rate can be changed between an area where many semiconductor chips have high temperatures, and an area where many semiconductor chips have low temperatures, whereby temperatures of the semiconductor chips are uniformed. Specifically, when the semiconductor chips have high junction temperatures, an air flow rate to these chips is increased by controlling the step motor 54 of the air flow adjusting means, and when the temperatures fall down to a suitable temperature range, the air flow rate is returned to that of a normal operation. But even by such adjustment of junction temperatures of the semiconductor chips 34 by controlling air flow rates from the air nozzles 44, actually some junction temperature deflection occurs among the semiconductor chips 34 on the burn-in board 10. In this case, a power supply amount to the integrated circuits 36 of the semiconductor chips 34 may be changed by the control device 60, whereby the heat generations of the semiconductor chips 34 are individually controlled, and junction temperatures of the semiconductor chips 34 are further made uniform. It is needless to say that the power supply to the integrated circuits 36 is made within an allowable range of power supply amount in an actual normal operation. In this manner, accurate screening can be achieved.

It should be noted that the temperature sensor 38a involved in this invention is not limited to the temperature detection diode formed on a semiconductor chip 34 separately from the integrated circuit 36, but may be any diode built in the integrated circuit 36. Otherwise, the temperature sensor may be a transistor built in the integrated circuit. Instead, a NiCr or WSi metal film resistor is formed on the semiconductor chip to use the metal film resistor as the temperature sensor. Further, the number of the air nozzle 44 is not specifically limited, and the air flow rate adjusting means can be in any form.

In the first embodiment, junction temperatures $T_j$ of the semiconductor devices 33 are adjusted by controlling flow rates of the heated air from the air nozzles 44.

But the junction temperatures $T_j$ can be adjusted by selectively controlling the ON/OFF of the air flow from the air nozzles 44.

Figure 12:
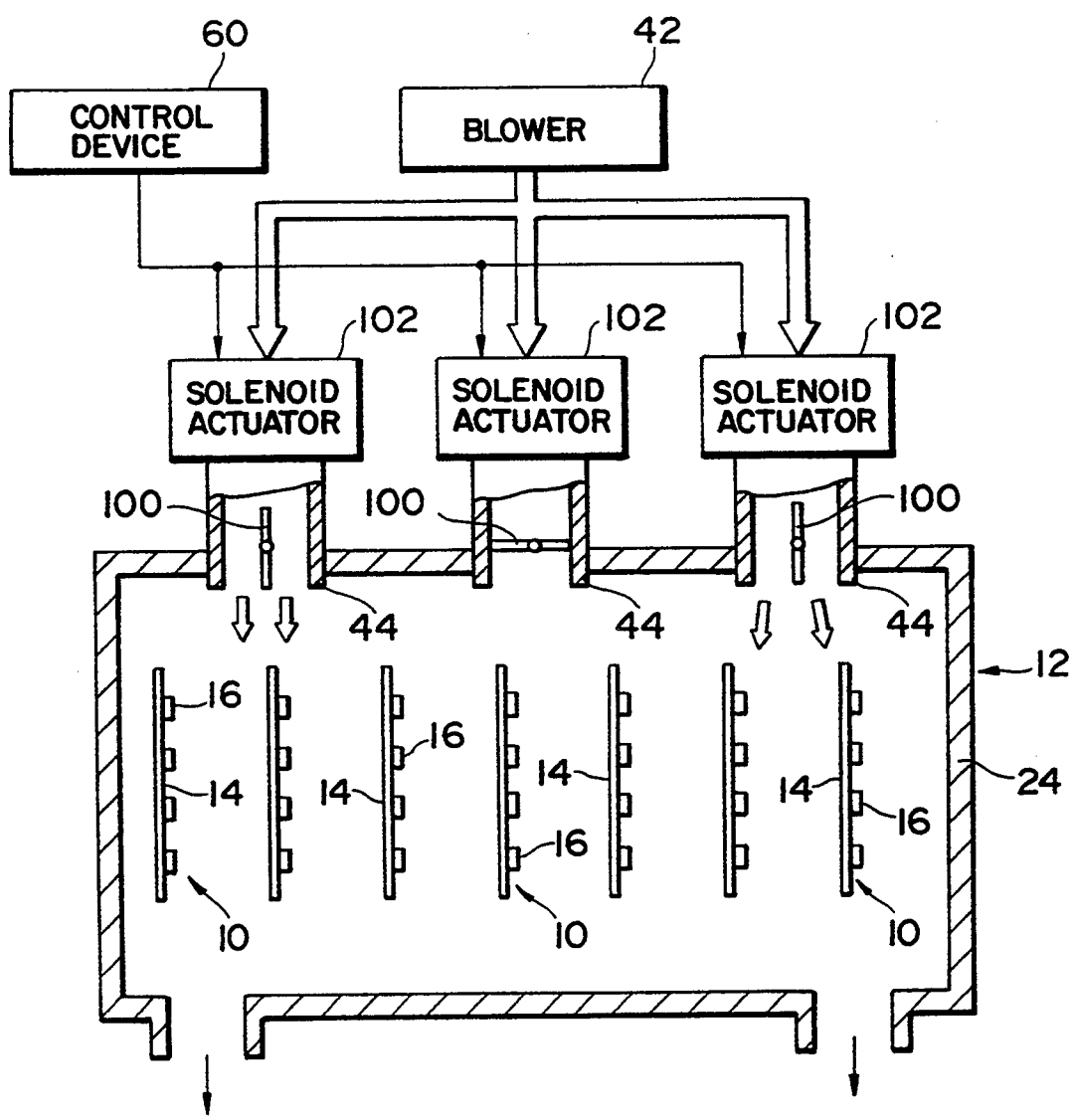
FIG. 12 is a diagrammatic view of an air flow system of the burn-in apparatus according to a second embodiment of this invention.

FIG. 12 shows the burn-in apparatus according to a second embodiment of this invention. The burn-in apparatus according to the second embodiment includes control means for opening and closing the air nozzles 44 for the ON/OFF control of the air flow. The second embodiment of FIG. 12 is the same as the first embodiment of FIGS. 3 to 11 except that the air flow rate adjusting means of the first embodiment is replaced by the control means for opening and closing the air nozzles. Common members of the second embodiment with the first embodiment have common reference numerals to omit their explanation.

Figure 13:
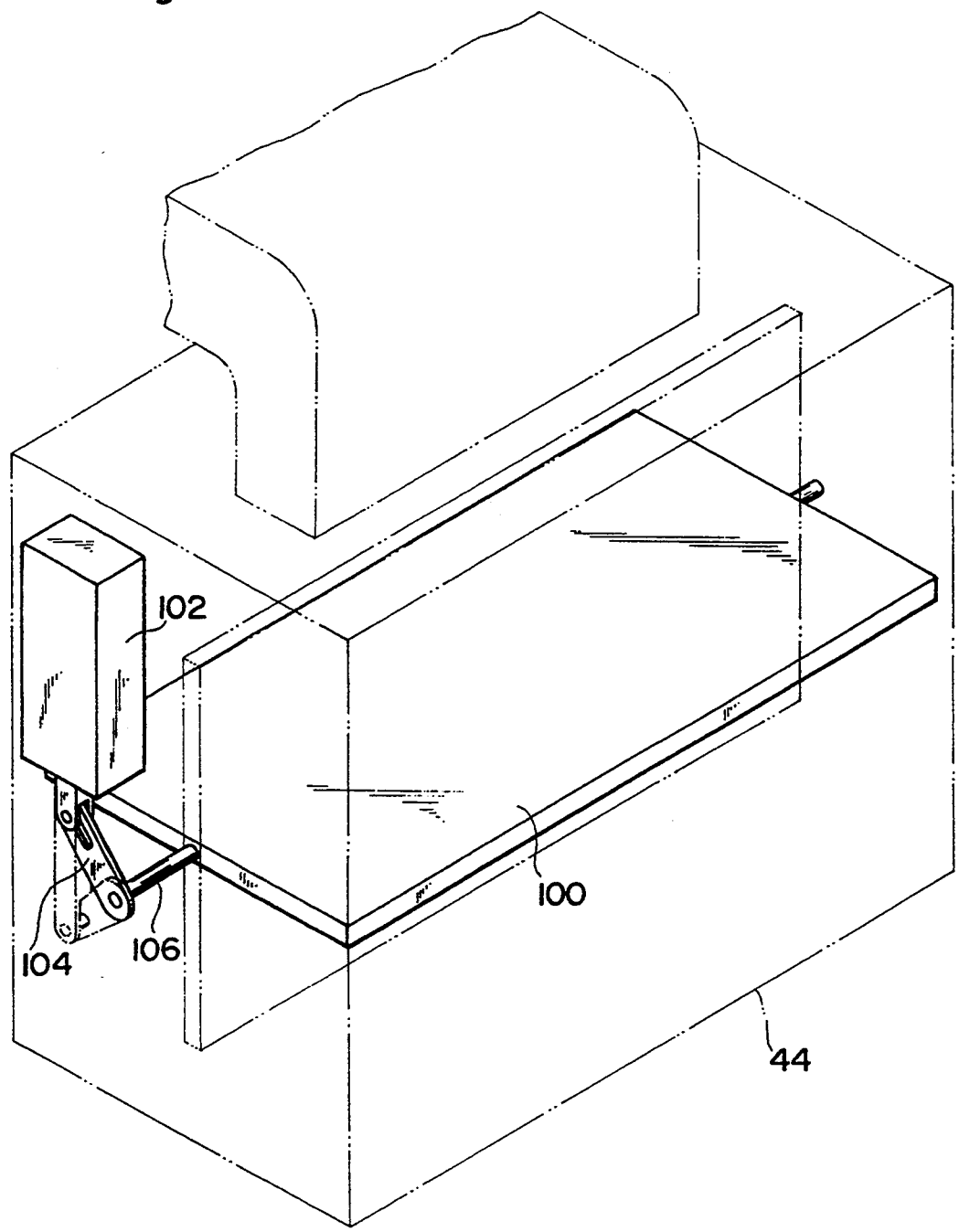
FIG. 13 is a perspective view of one example of opening and closing control means for opening and closing an air nozzle, which is used in the burn-in apparatus of FIG. 12.

Various types of the control means for opening and closing air nozzles can be proposed. But it is preferable that, as shown in FIG. 13, the means has a shutter 100 provided in the associated air nozzle 44 so that it can be rotated between an open position (indicated by the phantom line) and a close position (indicated by the solid line). The shutter 100 is rotated by a driving means, such as a solenoid actuator 102 connected to the rotary shaft 106 of the shutter 100 by a link mechanism 104, so as to control the ON/OFF of the air flow from the air nozzles 44. The actuator 102 is controlled by a control device 80. Referring back to FIG. 4A, similarly to the first embodiment, the control device 60 controls a power amount supplied by the power supply unit 62 to the integrated circuit 36 of a semiconductor chip 34, and also controls the actuator 102, which corresponds to the driving means 52 in FIG. 4A, to selectively open and close the air nozzles 44 on the basis of the monitored results of the temperature detection unit 84.

In operation, the shutter 100 normally takes a position where the associated air nozzle 44 is opened. However, when the control device 60 recognizes semiconductor devices (not shown in FIG. 12) whose junction temperatures $T_j$ are lower than a proper value, based on a signal from the temperature detecting unit 64, the control device 80 supplies a command to the associated actuator 102 to rotate the shutter 100 of the associated air nozzle 44 near the burn-in board 10 on which these semiconductor devices are mounted, and stop the air flow from the associated air nozzle 44. Consequently, the heat radiation of the semiconductor device 33 is decreased, and the junction temperature $T_j$ rises. When the junction temperature $T_j$ has reached the proper temperature range, the control device 60 rotates the shutter 100 in an opposite direction to open the associated air nozzle 44. It is also possible that the junction temperature $T_j$ of the semiconductor device 33 can be finely adjusted by changing a power supply amount within an allowable range.

Figure 14:
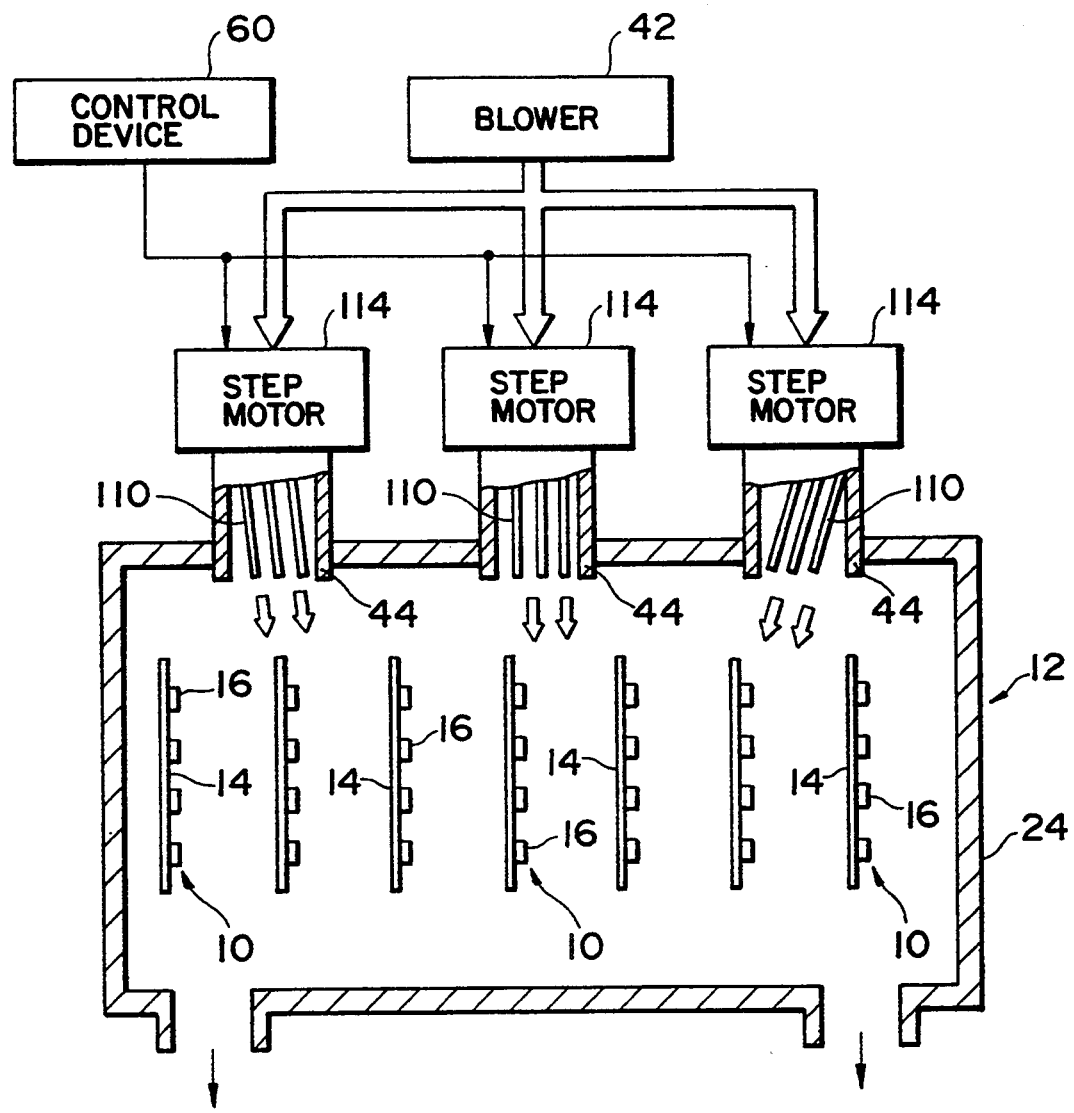
FIG. 14 is a diagrammatic view of an air flow system of the burn-in apparatus according to a third embodiment of this invention.
Figure 15:
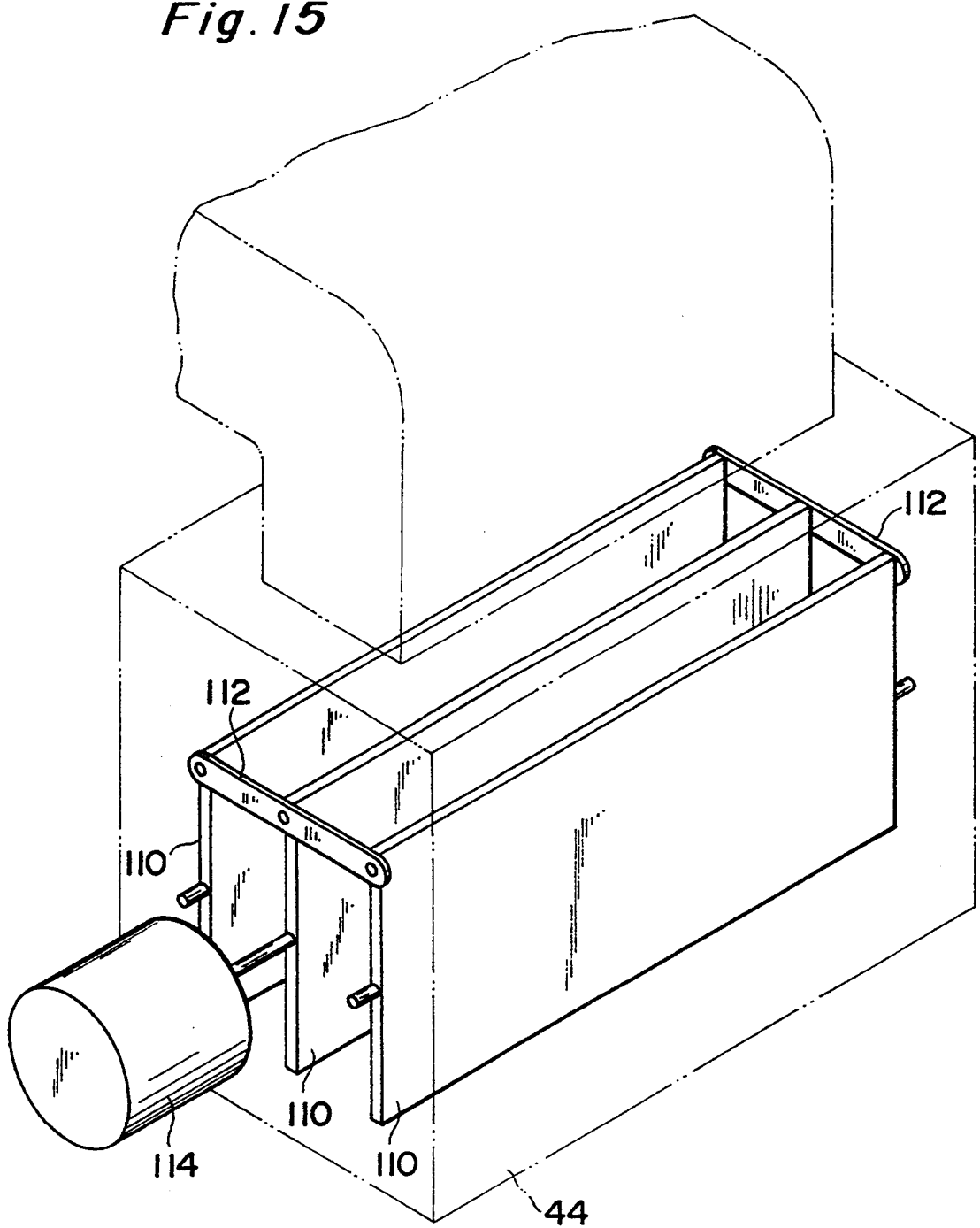
FIG. 15 is a perspective view of one example of air flow direction adjusting means of the burn-in apparatus of FIG. 14.

FIG. 14 shows a third embodiment of this invention. In this embodiment, an air flow direction adjusting means in place of the air flow rate adjusting means of FIG. 3 is provided to each air nozzle 44. FIGS. 14 and 15 show one example of the air flow direction adjusting means which includes a plurality of control plates swingably mounted in each air nozzle 44. The control plates 110 are interconnected parallel with each other by two connection rods 112 and can change their direction by the associated step motor 114 which is their driving means. A direction of the control plates 110 is changed to thereby change a direction of the heated air from the associated air nozzle 44.

The step motors 114 are connected to the control device 60. As in the above-described two embodiments, based on the monitored results of the temperature detecting unit 64, the step motors 114, which corresponds to the driving means 52 in FIG. 4A, are suitably controlled to change a direction of the air flow from the nozzles 44 (see FIG. 4A). The control device 60 individually controls directions of air flows from a plurality of air nozzles 44 to control surface temperatures or junction temperatures $T_j$ of all the semiconductor chips uniformly and with high precision. That is, in the case that in some areas where many semiconductors have high temperatures, and in other areas where many semiconductors have low temperatures, directions of the air flows from the respective air nozzles 44 are varied to thereby blow air to each of groups of the semiconductor devices 33 at different flow rates so that the junction temperatures of the semiconductor devices 33 be made uniform.

To be specific, in the case that a group of the semiconductor devices 33 have junction temperatures $T_j$ higher than a proper value, the control device 60 recognizes the presence of such semiconductor devices, based on monitored results of the temperature detecting unit 64, increases an air flow rate to the radiating and conducting members 90 (see FIG. 10) associated with the semiconductor devices 33, and controls the associated step motor 114 to change a direction of the control plates 110 in the associated air nozzle 44. Consequently the heat radiation and conduction lower the junction temperatures $T_j$ of the semiconductor devices 33. Reversely, in the case of semiconductor devices whose junction temperatures $T_j$ are lower than the proper value, the control device 60 sets a direction of the control plates 110 so as to decrease the flow rate of air applied to such devices. When the junction temperatures $T_j$ have arrived at the proper range, the control device 60 returns the control plates 110 to their normal direction. Thus accurate screening can be obtained.

Figure 16:
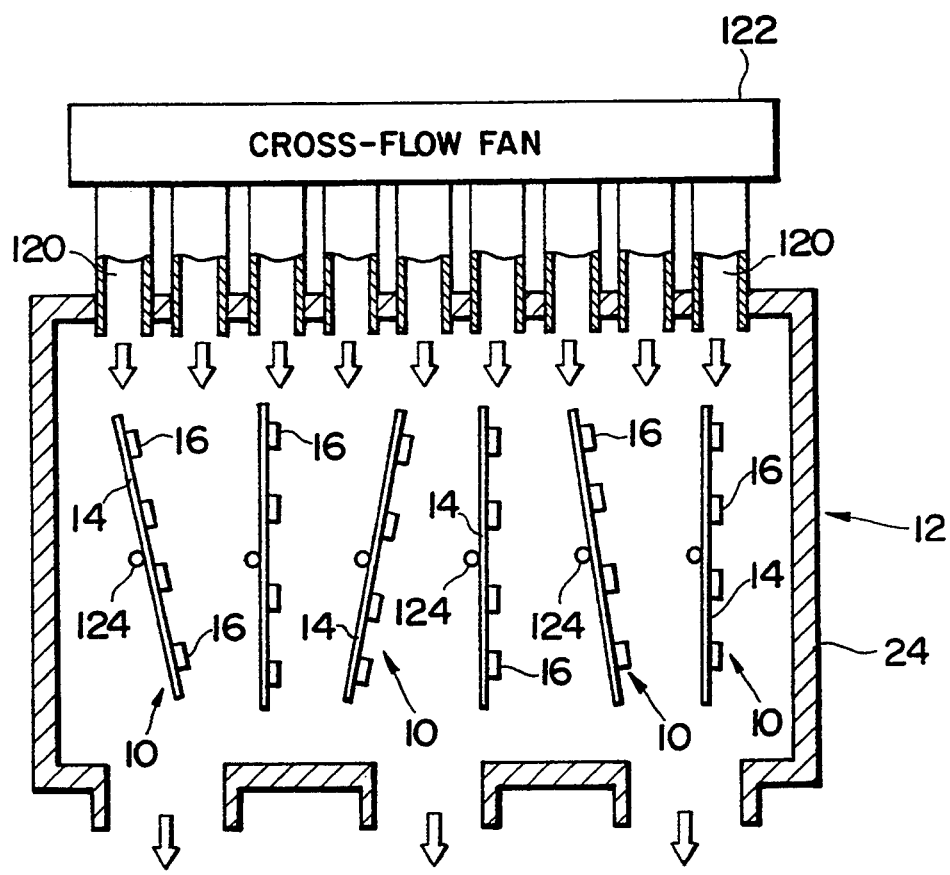
Figure 18:
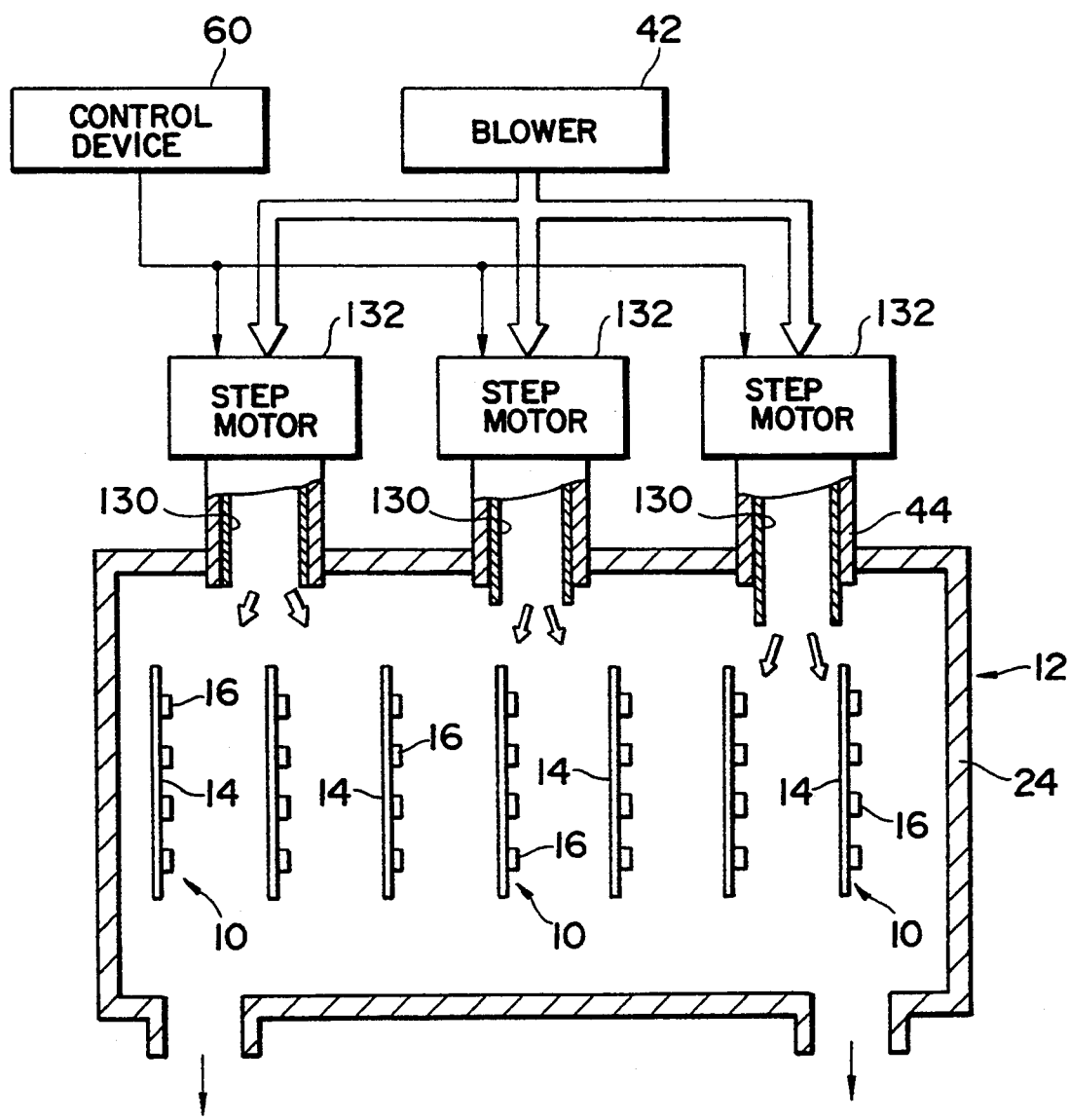
FIG. 18 is a diagrammatic view of an air flow system of the burn-in apparatus according to a fourth embodiment of this invention.

As the means for adjusting rates of air flows to the respective burn-in boards 10, a method of individually controlling directions of the respective burn-in boards 10 is proposed in addition to the method of changing directions of air flows from the air nozzles 44. FIG. 18 shows the burn-in apparatus according to a fourth embodiment of this invention, which includes means for controlling directions of the burn-in boards. In the fourth embodiment of FIG. 16, the box body 24 of a burn-in test chamber 12 has a number of air nozzles 120. Heated air generated by blower, such as a cross-flow fan 122 with a heater (not shown) is fed to the interior of the chamber 12 through the air nozzles 120.

Figure 17:
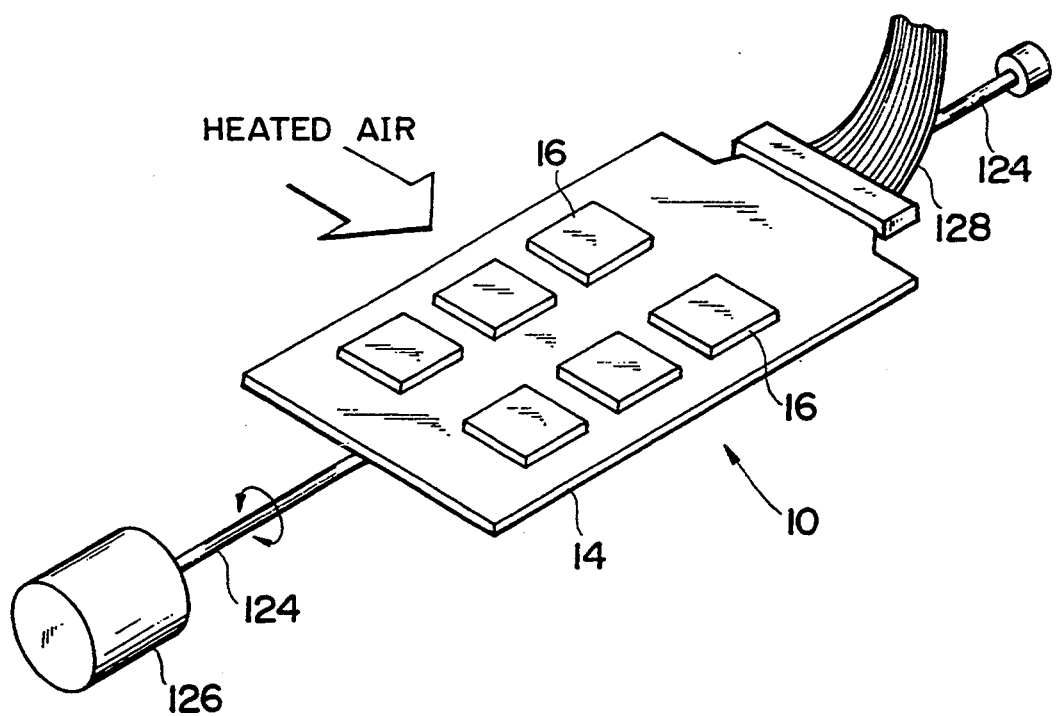
FIG. 17 is a perspective view of one example of the structure for changing direction of a burn-in boards which is used in the burn-in apparatus of FIG. 16.

As shown in FIG. 17, the board 14 of each burn-in board 10 is secured to a rotary shaft 124 horizontally provided in the burn-in test chamber 12. The rotary shaft 124 is connected to a step motor 126 which is a driving means, and is controlled by a control device 60 to be rotated by a required angle. Sockets 16 are secured to the board 14 for receiving semiconductor devices to be tested. In this embodiment, since the burn-in boards 10 are rotated, external terminals connected to the terminals of the sockets 16 are connected to a board connector (30 in FIG. 2) provided in the burn-in test chamber 12 through a connector cable 128.

Reference will be made back to FIG. 4A. An allowable junction temperature range is previously set by an operator in the control device 60 and stored by a memory. When a burn-in test is started, electric characteristics of the temperature detection diodes 38 of the respective semiconductor devices 33 are measured, and junction temperatures $T_j$ of the respective semiconductor devices 33 are individually monitored by the temperature detecting means 64. Then, the control device 60 compares actually measured values of the junction temperatures $T_j$ of the respective semiconductor devices 33 with the preset values. The burn-in test goes on with a direction of the burn-in boards 10 retained in their original position or vertical position until the actually measured values of the junction temperatures $T_j$ of the respective semiconductor devices 33 exceed the preset value. In the case that the actually measured values of some semiconductor devices 33 have exceeded the preset value, the burn-in board 10 associated with such semiconductor devices 33 is rotated so as to correct the junction temperatures $T_j$ to be within the proper range. That is, since the sockets 16 on the burn-in board 10 are directed to the associated air nozzle 120, an air flow rate to be applied to the associated sockets 16 is increased to thereby lower a temperature of the semiconductor device 33 in each socket 16.

In this way, the reduction of screening tests to tests for different purposes can be prevented, and accurate screening is enabled. Since the environmental temperature $T_a$ inside the burn-in test chamber 12 in which burn-in tests are conducted varies among inside locations, depending on positions of the heater and the air nozzles 120, and on directions, flow rates and so on of the air, it can happen that some semiconductor devices 33 have high temperatures, and others 33 have low temperatures. But in such cases, temperatures of the semiconductor devices can be made uniform because directions of the burn-in boards 10 are changed by the step motors 126, and air flow rates to be applied to the sockets and thus to the semiconductor devices 33 are adjusted to individually control heat radiation and conduction amounts of respective semiconductor devices. As results, burn-in tests are not conducted at unnecessary high temperatures or low temperatures, and accurate screening is enabled.

Figure 19:
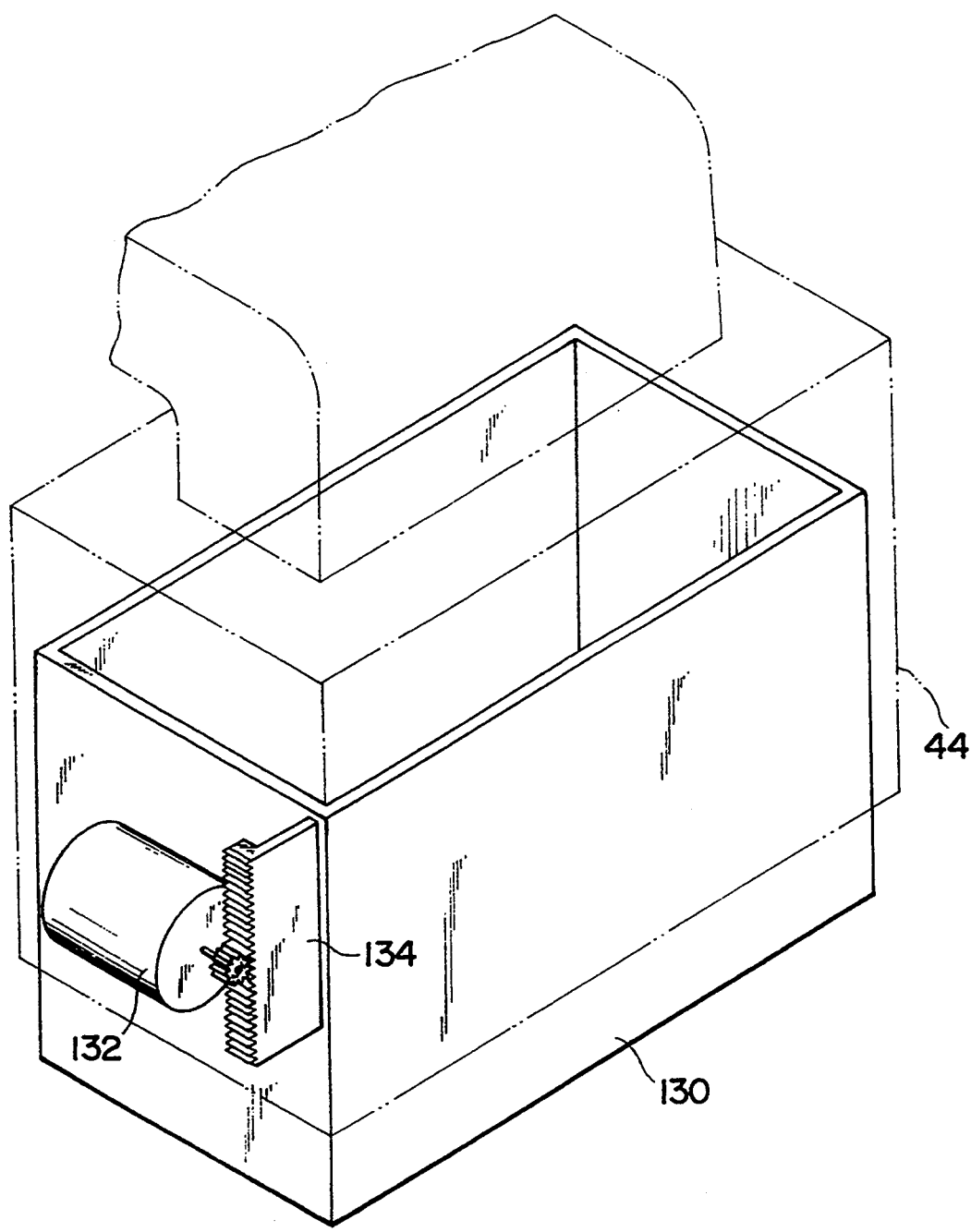
FIG. 19 is a perspective view of one example of means for changing positions of an air outlet, which is used in the burn-in apparatus of FIG. 18.

FIGS. 18 and 19 show the burn-in apparatus according to a fifth embodiment of this invention. In this embodiment, a guide pipe 130 is slidably in each of air nozzles 44. The guide pipe 130 is connected to a step motor 132 as a driving means through a transmission mechanism, such as a pinion and rack mechanism 134. When the step motor 132 is driven, the guide pipe 130 is vertically slid to bring an opening, or air outlet in the forward end thereof toward or away from burn-in boards 10.

The step motors 132 are connected to a control device 80 to be controlled by the same. As in the above-described embodiments, the control device 60 controls power amounts to be supplied by power supply unit 62 to integrated circuits 36, based on monitored results of a temperature detecting means 64, and also controls the step motors 132 which correspond to the driving means 52 in FIG. 4A. The control device 60 stores a allowable range of the junction temperature for burn-in tests, and is programmed to compare the monitored results of the temperature detecting unit 64 to control the power supply unit 62 and the step motors 132.

The control device 60 recognizes areas where many semiconductor devices have high junction temperatures $T_j$ and areas where many semiconductor devices have low junction temperatures, based on monitored results of the temperature detecting unit 64, and, based on this recognition, controls the step motors 32 to slide associated guide pipes 130. Thus locations of the air outlets of the associated air nozzles 44 are changed to make the junction temperatures $T_j$ uniform. Specifically, n the case that some semiconductor devices 33 have high junction temperatures $T_j$, guide pipe 13 near these semiconductor devices is projected out of the associated air nozzle 44 to approach the air outlet to the devices 33. Thus, an air flow rate for the devices 33 is increased, and the heat radiation and conduction of the devices lower the junction temperatures $T_j$. When the junction temperatures $T_j$ are lowered to the proper range, the guide pipe is withdrawn to its normal position. Reversely, in the case that some semiconductor devices 33 have low junction temperatures $T_j$, a guide pipe near these devices 33 is moved away from the devices 33.

Figure 20:
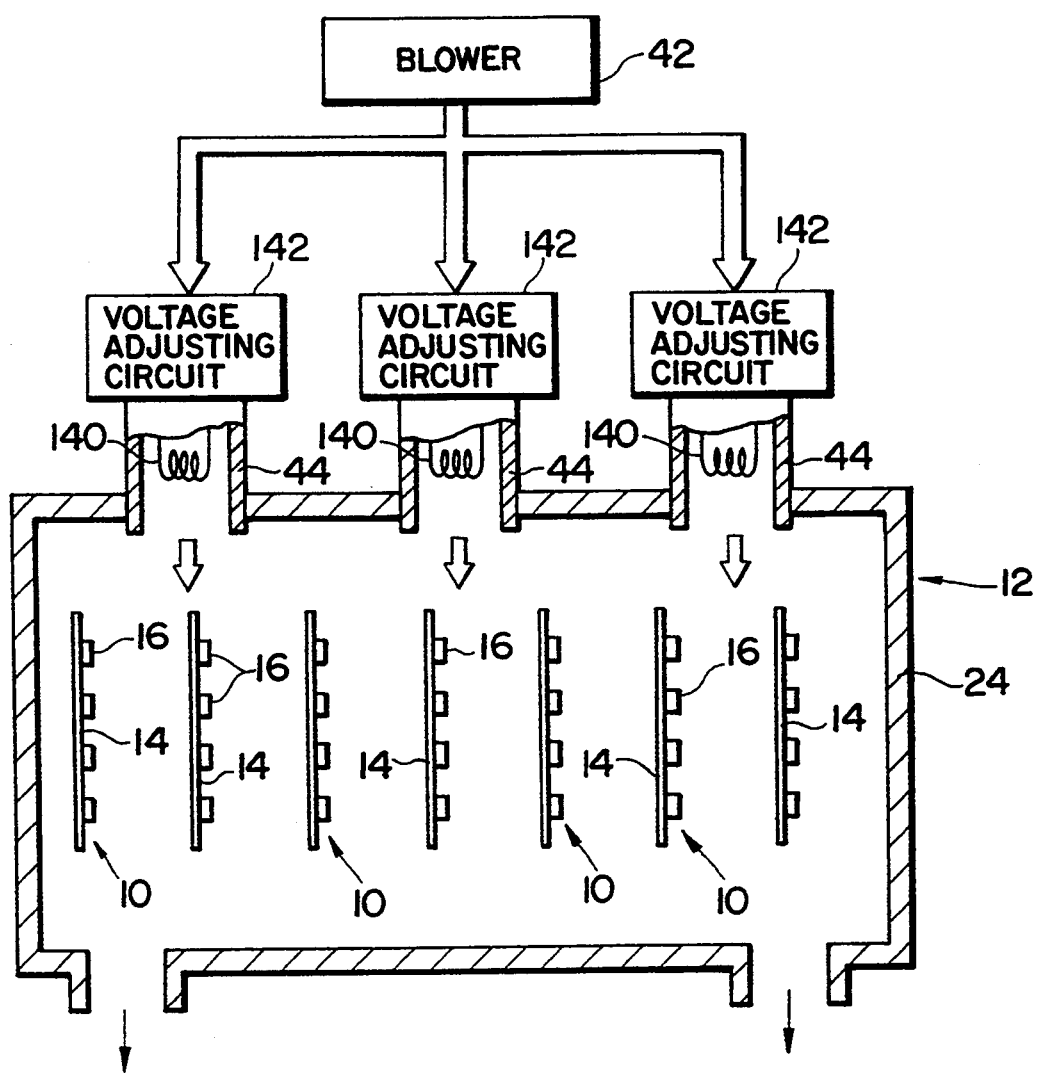
FIG. 20 is a diagrammatic view of an air flow system of the burn-in apparatus according to a sixth embodiment of this invention.

FIG. 20 shows the burn-in apparatus according to a sixth embodiment of this invention. In this embodiment, a heater 140 is provided in each air nozzle 44 for increasing temperature in a burn-in test chamber 12. The heaters 140 are connected to a control device 60 through voltage adjusting circuits 142 to be controlled by the control device 60 for changing heat generation amounts thereof.

Referring again to FIG. 4A, the control device 60 compares monitored results from the temperature detecting unit 64 with a pre-stored allowable range of a junction temperature $T_j$ for a burn-in test to control the voltage adjusting circuits 142, which correspond to the driving means 52 in FIG. 4A, and to adjusting heat generation amounts of the heaters. Thus, temperatures of the air flows can be varied between an area where many semiconductor devices have high junction temperatures and an area where many semiconductor devices have low junction temperatures. Consequently, junction temperatures can be made uniform. To be specific, for semiconductor devices 33 having high junction temperatures, a heat generation amount of the heater 140 in an air nozzle 44 near the devices 33 is increased to supply a high temperature air flow. On the other hand, for semiconductor devices 33 having low junction temperatures, a temperature of the heater 140 in an air nozzle 44 near the semiconductor devices 33 is lowered to supply a low temperature air flow. When the junction temperatures of all the devices 33 arrive at the proper range, the heaters are returned to a heater temperature at the normal operation. In this case as well, the control device 60 controls the power supply unit 62 to change power supply amounts to the integrated circuits 36 of the respective semiconductor devices 33 so as to finely adjust their junction temperatures. Consequently, accurate screening can be achieved.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A burn-in apparatus comprising:
   a burn-in test chamber having a plurality of air nozzles, each nozzle directing heated air into said burn-in test chamber;
   a burn-in board, disposed in said burn-in test chamber, for mounting a semiconductor device having a semiconductor chip having a temperature sensor therein;

measuring means for detecting electric characteristics of said temperature sensor to individually measure a junction temperature of said semiconductor chip and outputting a temperature signal indicative thereof;

air flow control means for controlling air flow from said nozzles onto said burn-in board to control amounts of heat radiated on said semiconductor chip to adjust said junction temperature of said semiconductor chip; and means for controlling, in accordance with said temperature signal, said air flow control means to control said amounts of heat to cause said junction temperature to be within a predetermined temperature range.

2. A burn-in apparatus according to claim 1, wherein said air flow control means includes a plurality of air flow rate adjusting means, each disposed in one of said nozzles, for adjusting air flow rates from said nozzles respectively, and said controlling means individually controls each of said air flow rate adjusting means.

3. A burn-in apparatus according to claim 1, wherein said air flow control means includes a plurality of opening and closing control means, each disposed in said nozzles, for controlling opening and closing of said air nozzles to control air flows from said nozzles respectively, and said controlling means individually controls each of said opening and closing control means.

4. A burn-in apparatus according to claim 1, wherein said air flow control means includes a plurality of air flow direction adjusting means, each disposed in said nozzles, for changing air flow directions of said nozzles, and said controlling means individually controls each of said air flow direction adjusting means.

5. A burn-in apparatus according to claim 1, wherein said air flow control means includes a plurality of outlet position changing means, each disposed in said nozzles, for moving outlets of said nozzles toward and away from said semiconductor device, and said controlling means individually controls each of said outlet position changing means.

6. A burn-in apparatus according to claim 1, wherein said air flow control means includes a plurality of heating means, each disposed in said nozzles, for adjusting temperatures of air flows from said nozzles, and said controlling means individually controls each of said heating means.

7. A burn-in apparatus according to claim 1, wherein said burn-in board is rotatable in said burn-in test chamber, said air flow control means includes means for rotating said burn-in board to change orientation of said burn-in board in relation to an air flow direction of said nozzles, and said controlling means individually controls each of said rotating means.

8. A burn-in apparatus according to claim 1, including power supply means for supplying electric power to said semiconductor chip, and said controlling means further controls, in accordance with said temperature signal, said power supply means to individually control said electric power provided to said semiconductor chip to maintain said junction temperature of said semiconductor chip within said predetermined temperature range.

9. A burn-in apparatus according to claim 1, wherein said temperature sensor is a Schottky junction diode formed on said semiconductor chip.

10. A burn-in apparatus according to claim 1, wherein said temperature sensor is a pn junction diode formed on said semiconductor chip.

11. A burn-in apparatus according to claim 1, wherein said temperature sensor is a transistor formed on said semiconductor chip.

12. A burn-in apparatus according to claim 1, wherein said temperature sensor is a metal film resistor formed on said semiconductor chip.

13. A burn-in apparatus according to claim 1, wherein said measuring means applies various voltages to said temperature sensor to measure a voltage value which produces a specific current value representative of said junction temperature.

14. A burn-in method comprising the steps of:
positioning a burn-in board, comprising a semiconductor device, in a burn-in test chamber having a plurality of nozzles for directing heated air into said burn-in test chamber, said semiconductor device comprising a semiconductor chip having a temperature sensor therein;

detecting electric characteristics said temperature sensor to individually measure a junction temperature of said semiconductor chip; and controlling air flow from said nozzles onto said burn-in board to control amounts of heat radiated on said semiconductor chip to maintain said junction temperature within a predetermined range.

15. A burn-in method according to claim 14, wherein the controlling step comprises the step of individually controlling air flow rates from each of said nozzles.

16. A burn-in method according to claim 14, wherein the controlling step comprises the step of individually controlling air flows from each of said nozzles in an on and off manner.

17. A burn-in method according to claim 14, wherein the controlling step comprises the step of individually controlling directions of air flows from each of said nozzles.

18. A burn-in method according to claim 14, wherein the controlling step comprises the steps of individually controlling outlet positions of each of said nozzles relative to said semiconductor device.

19. A burn-in method according to claim 14, wherein the controlling step comprises the step of individually controlling temperature of said air flowing from each of said nozzles.

20. A burn-in method according to claim 14, wherein the controlling step comprises the step of rotating said burn-in board to change orientation of said burn-in board in relation to an air flow direction of said nozzles.

21. A burn-in method according to claim 14, further comprising the step of controlling an amount of electric power provided to said semiconductor chip to maintain said junction temperature of said semiconductor chip within a predetermined range.

22. A burn-in method according to claim 14, wherein said detecting step comprises the step of measuring said junction temperature in accordance with an electric characteristic of said temperature sensor and predetermined parameters.

23. A burn-in method according to claim 22, wherein said temperature sensor is a Schottky junction diode, and said parameters for said temperature sensor for deriving said junction temperature thereof represent an applied voltage at a specific junction temperature for causing a current of a specific value to flow and a temperature coefficient of said applied voltage.

24. A burn-in method according to claim 22, wherein said temperature sensor is a Schottky junction diode, and said parameters for said temperature sensor for deriving said junction temperature thereof represent an applied voltage at a specific junction temperature for causing a current to flow and a value of n in the following Formula, said parameters being derived in accordance with the following Formula:

$$I_F \approx SA^*T^2 \exp\left(-\frac{q\phi_B}{kT}\right)\exp\left(\frac{qV_F}{nkT}\right)$$

$I_F$: Forward current
$V_F$: Forward voltage
S: Schottky junction area
A*: Effective Richardson constant
T: Absolute temperature
k: Boltzmann constant
q: Electron charge
$\phi_B$: Barrier height 25. A burn-in method according to claim 22, wherein said temperature sensor is a pn junction diode, and said parameters for said temperature sensor for deriving said junction temperature thereof represent an applied voltage at a specific junction temperature for causing a current of a specific value to flow and a temperature coefficient of said applied voltage.

26. A burn-in method according to claim 22, wherein said temperature sensor is a transistor, and said parameters for deriving said junction temperature of said temperature sensor represent an applied voltage at a specific junction temperature for causing a current of a specific value to flow and a temperature coefficient of said applied voltage.

27. A burn-in method according to claim 22, wherein said temperature sensor is a metal film, and said parameters for deriving said junction temperature of said temperature sensor represent an applied voltage at a specific junction temperature for causing a current of a specific value to flow and a temperature coefficient of said applied voltage.

* * * * *